United States Patent
Tsai

(10) Patent No.: US 8,692,393 B2
(45) Date of Patent: Apr. 8, 2014

(54) ALIGNMENT MARK DESIGN FOR SEMICONDUCTOR DEVICE

(75) Inventor: Feng-Nien Tsai, Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 13/494,879

(22) Filed: Jun. 12, 2012

(65) Prior Publication Data
US 2013/0328221 A1    Dec. 12, 2013

(51) Int. Cl.
*H01L 23/544*    (2006.01)

(52) U.S. Cl.
USPC .................................. 257/797; 257/E23.179

(58) Field of Classification Search
USPC .......................................... 257/797, E23.179
See application file for complete search history.

(56) References Cited

U.S. PATENT DOCUMENTS

| | | | | |
|---|---|---|---|---|
| 5,525,840 | A * | 6/1996 | Tominaga | 257/797 |
| 6,285,439 | B1 * | 9/2001 | Miyatake | 355/53 |
| 6,486,954 | B1 * | 11/2002 | Mieher et al. | 356/401 |
| 7,751,047 | B2 * | 7/2010 | Bijnen et al. | 356/401 |
| 2012/0208341 | A1 * | 8/2012 | Marokkey et al. | 438/400 |

* cited by examiner

*Primary Examiner* — Tu-Tu Ho
(74) *Attorney, Agent, or Firm* — Baker & McKenzie LLP

(57) ABSTRACT

Better alignment mark designs for semiconductor devices may substantially lessen the frequency of layer misalignment scanner alignment problems. Exemplary alignment mark designs substantially avoid or minimize damage during the fill-in and etching and chemical mechanical processing processes. Thus, additional processing steps to even out various layers or to address the misalignment problems may also be avoided.

11 Claims, 24 Drawing Sheets

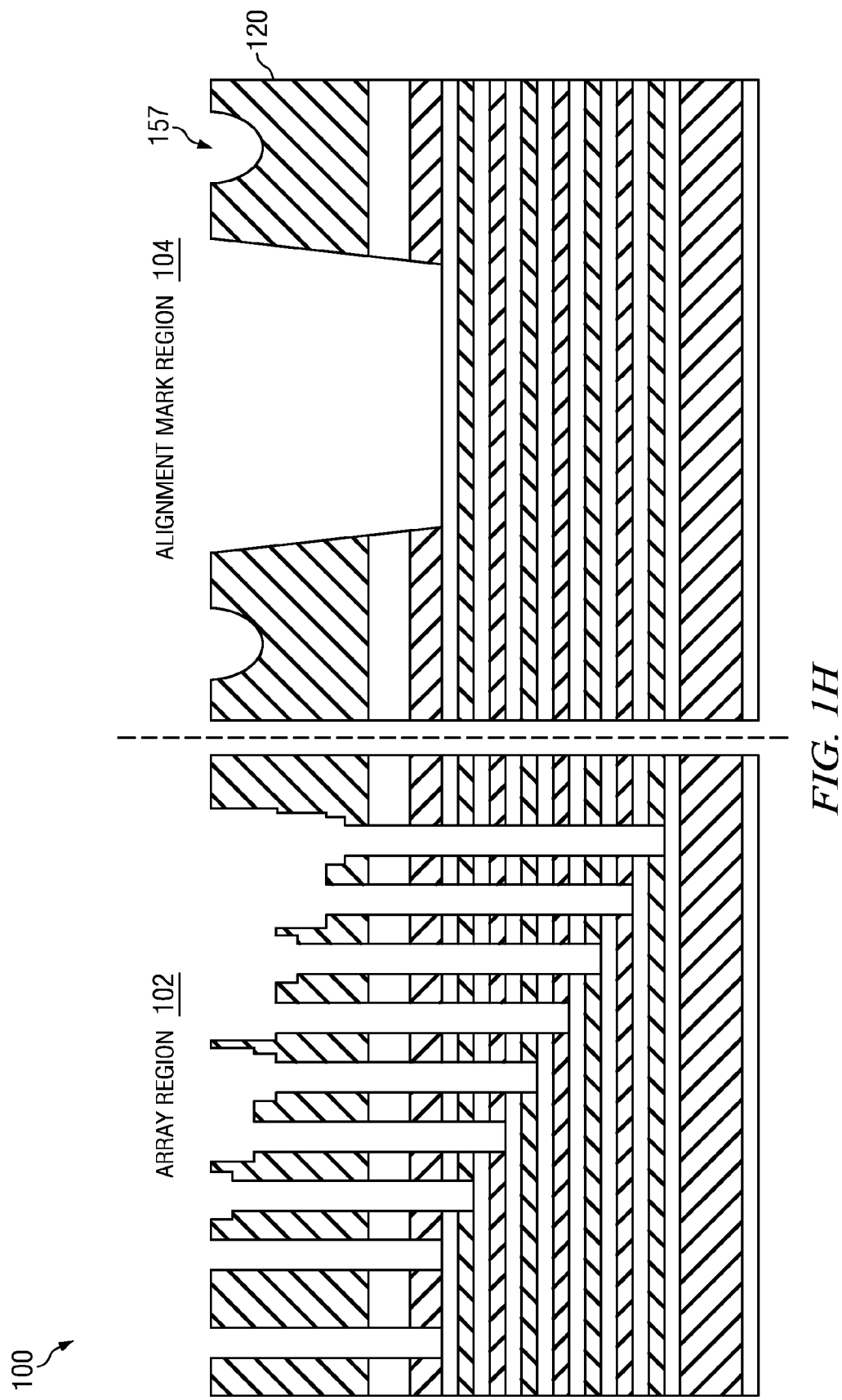

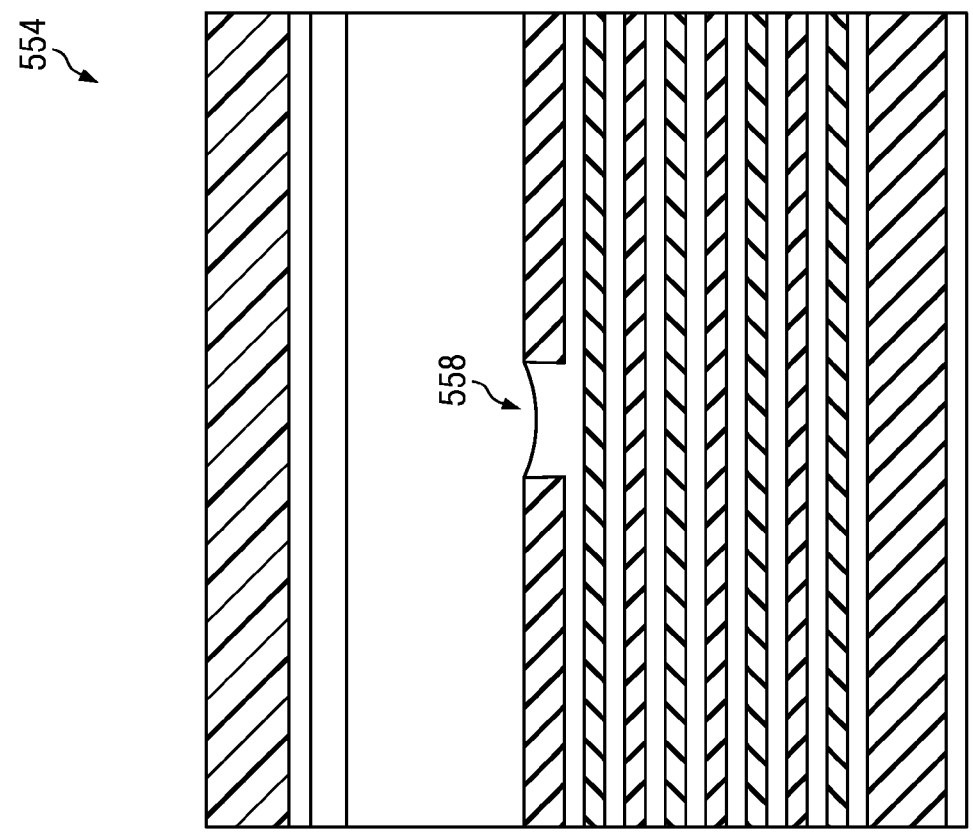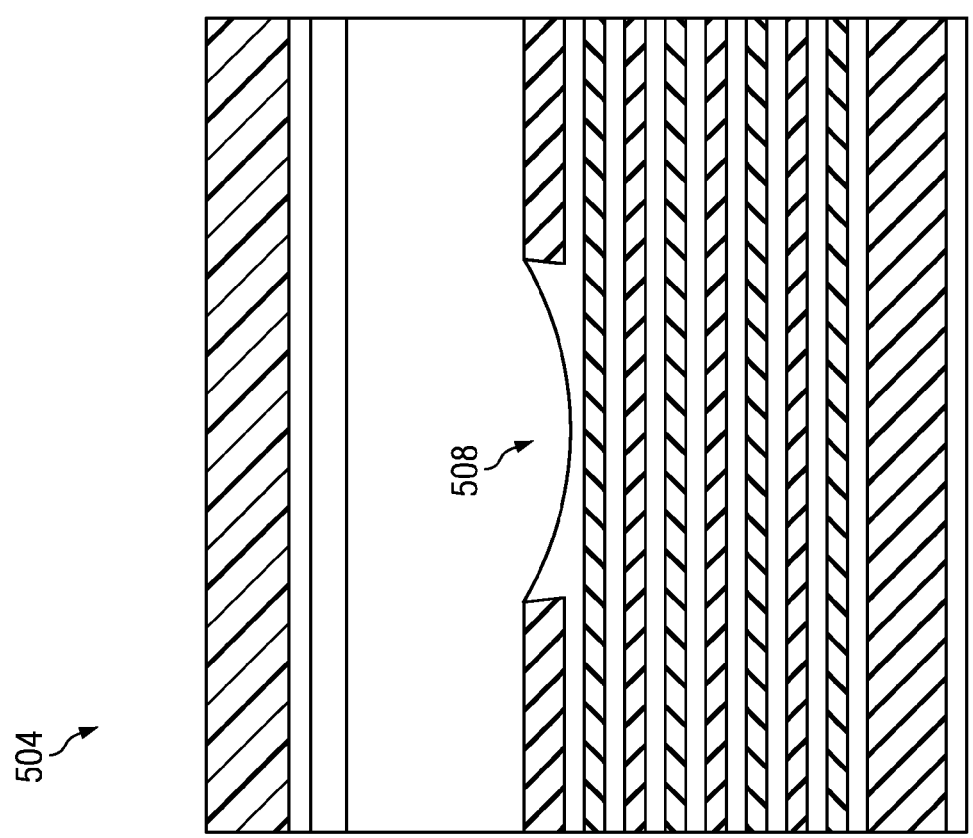
FIG. 5

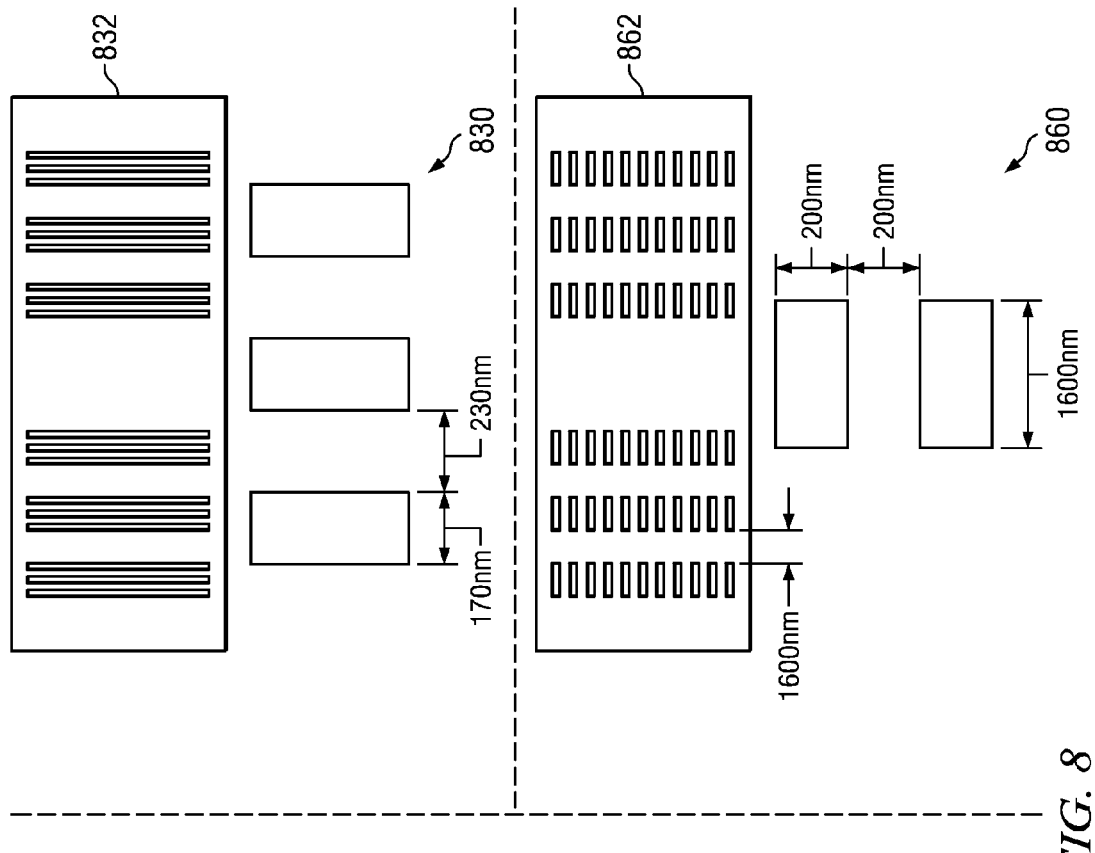
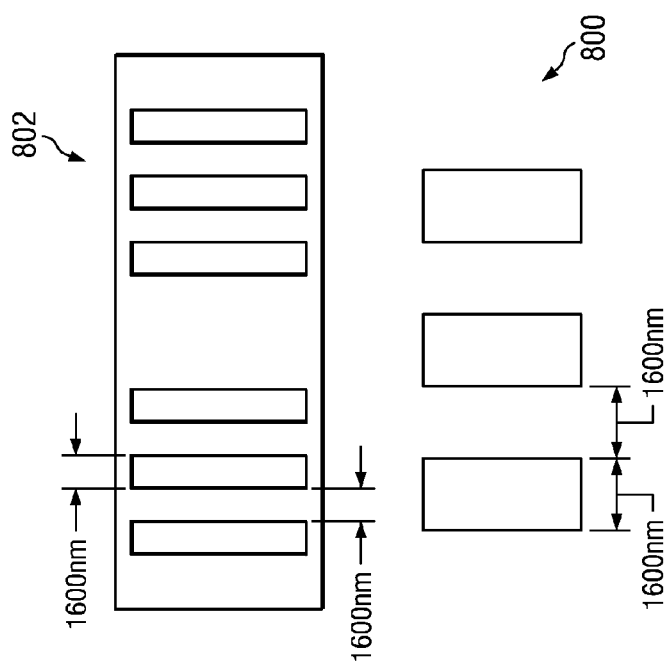
FIG. 8

ALIGNMENT MARK DESIGN FOR SEMICONDUCTOR DEVICE

TECHNICAL FIELD

This disclosure relates generally to semiconductor devices and, more specifically, relates alignment mark design for semiconductor memory devices.

BACKGROUND

Semiconductor device fabrication involves a series of patterned layers formed using photolithography masks. For semiconductor devices to perform properly, each patterned layer should be aligned as precisely as possible with other patterned layers in the device. In other words, the overlay misalignment and error should be minimized.

One alignment technique is known as the ATHENA (Advanced Technology using High order Enhancement of Alignment) mark alignment technique. Another alignment technique is known as the SMASH (Smart Alignment Sensor Hybrid) mark alignment technique. ATHENA marks are formed in the scribe line area provided between chips. In the ATHENA mark alignment technique, light is radiated onto the wafer. The radiated light is diffracted by the alignment marks, and the diffraction pattern is detected. The relative position of the wafer and the photolithography mask is then adjusted accordingly. The quality of the diffracted light from the alignment mark is a directly related to the structure of the alignment mark—i.e., the material, depth, dimensions, etc. of the alignment mark. Typically, each alignment mark comprises a topographical pattern, such a plurality of grooves and lands, which can be formed by, for example etching a controlled depth into wafer. Once the alignment mark is formed on a wafer, it will be used for position detection in subsequent processes.

However as the wafer undergoes the various patterned layer forming processes and steps, the integrity of the alignment mark on the wafer may be compromised. For example, some of the intermediate processing steps of forming circuit patterns on the wafer, such as chemical mechanical polishing (CMP) or deposition of thick or opaque layer, can damage or distort the alignment marks on the wafer, causing difficult detection of the alignment mark and, hence, misalignment or errors in aligning the various patterned layers of the semiconductor device.

BRIEF SUMMARY

Disclosed herein are enhanced alignment mark designs for alignment mark regions of semiconductor devices.

An alignment mark region of a semiconductor device may include an array of alignment marks with a plurality of alignment marks arranged in alignment columns and rows. Adjacent alignment marks in the plurality of alignment columns are separated by a first separation, and adjacent alignment columns are separated by a second separation.

According to an aspect, the first separation may be shorter than the second separation.

According to another aspect, the alignment marks may have an alignment mark width and an alignment mark height, and the alignment mark height may be substantially equal to the first separation. The alignment mark height may be in the range of 150 nm to 250 nm, and the alignment mark width may be in the range of 1500 nm to 1700 nm.

According to another aspect, the first separation may be in the range of 150 nm to 250 nm, and the second separation is in the range of 1500 nm to 1700 nm.

According to another aspect, the alignment mark region may further comprise a second array of alignment marks substantially similar to the array of alignment marks and separated from the array of alignment marks by a third separation. The third separation may be substantially equal to a width defined by the plurality of alignment columns.

Another exemplary alignment mark design for an alignment mark region of a semiconductor device may include a plurality of columnar alignment marks. Two adjacent columnar alignment marks are separated by a first distance, and two other adjacent columnar alignment marks are separated by a second distance greater than the first distance.

According to an aspect, the first distance may be in the range of 200 nm to 250 nm.

According to another aspect, the columnar alignment marks have a columnar alignment mark width and a columnar alignment mark height, and the columnar alignment mark width may be in the range of 150 nm to 200 nm. For example, the first distance may be 230 nm and the columnar alignment mark width may be 170 nm.

According to another aspect, the plurality of columnar alignment marks may include sets of columnar alignment marks. And the plurality of columnar alignment marks may further include groupings of the one or more sets of columnar alignment marks.

According to another aspect, within each of the one or more sets, the columnar alignment marks may be separated by the first distance, and the one or more sets may be separated by the second distance.

Another exemplary design for an alignment mark region may include a first alignment mark group having a plurality of alignment mark column sets and a second alignment mark group having a plurality of alignment mark column sets. The alignment mark column sets each have a plurality of alignment mark elements, and the total width of the first and second alignment mark groups define a mark design width in the range of 40-820 μm.

According to an aspect, the height of the first and second alignment mark groups is in the range of 20-74 μm.

According to another aspect, the plurality of alignment mark elements is a plurality of columnar alignment marks. The first alignment mark group has a first group width in the range of 7-9 μm, and the second alignment mark group has a second group width in the range of 7-9 μm. The first and second alignment mark groups are separated by a group separation distance in the range of 6-10 μm.

According to another aspect, the plurality of alignment mark elements comprises a plurality of alignment mark row elements, the first alignment mark group has a first group width in the range of 7-9 μm, and the second alignment mark group has a second group width in the range of 7-9 μm. The first and second alignment mark groups are separated by a group separation distance in the range of 6-10 μm.

BRIEF DESCRIPTION OF THE DRAWINGS

FIG. 5 is another schematic diagram illustrating alignment mark regions of semiconductor devices, in accordance with the present disclosure;

FIG. 8 is a schematic diagram illustrating alignment mark design, in accordance with the present disclosure.

DETAILED DESCRIPTION

Figure 1A:
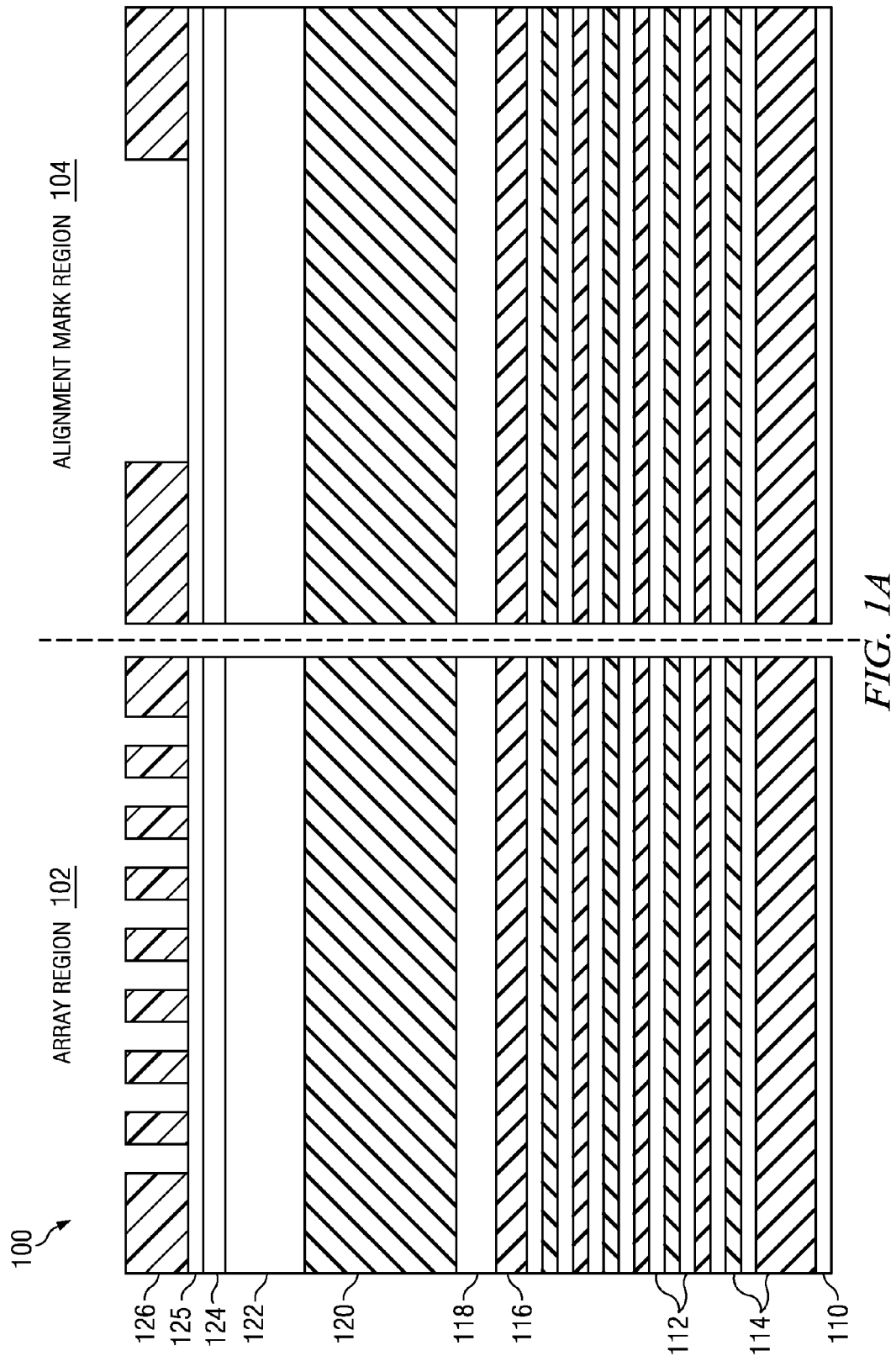
FIGS. 1A-1Q are schematic diagrams illustrating formation of semiconductor devices with alignment marks.
Figure 1B:
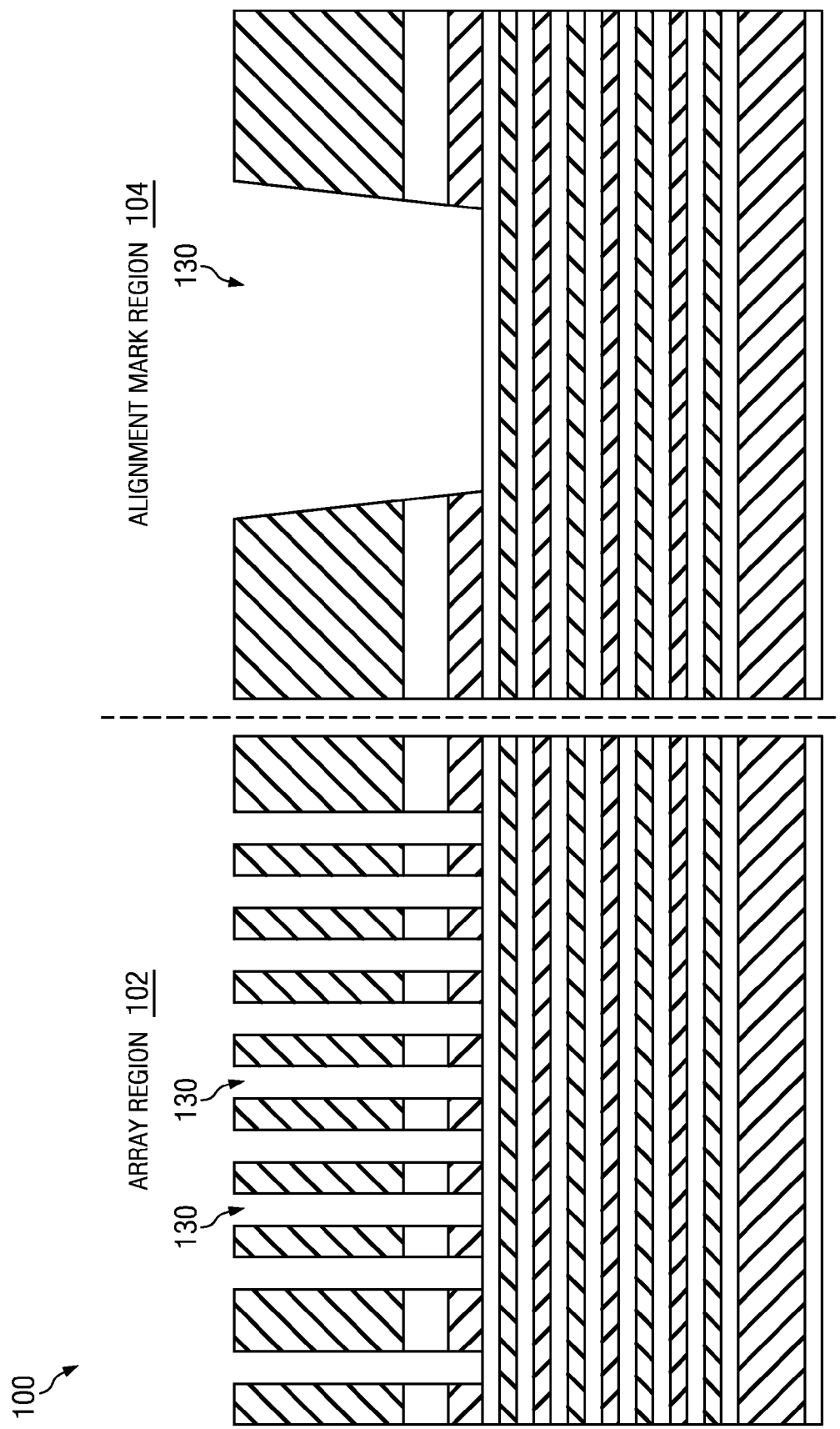
Figure 1C:
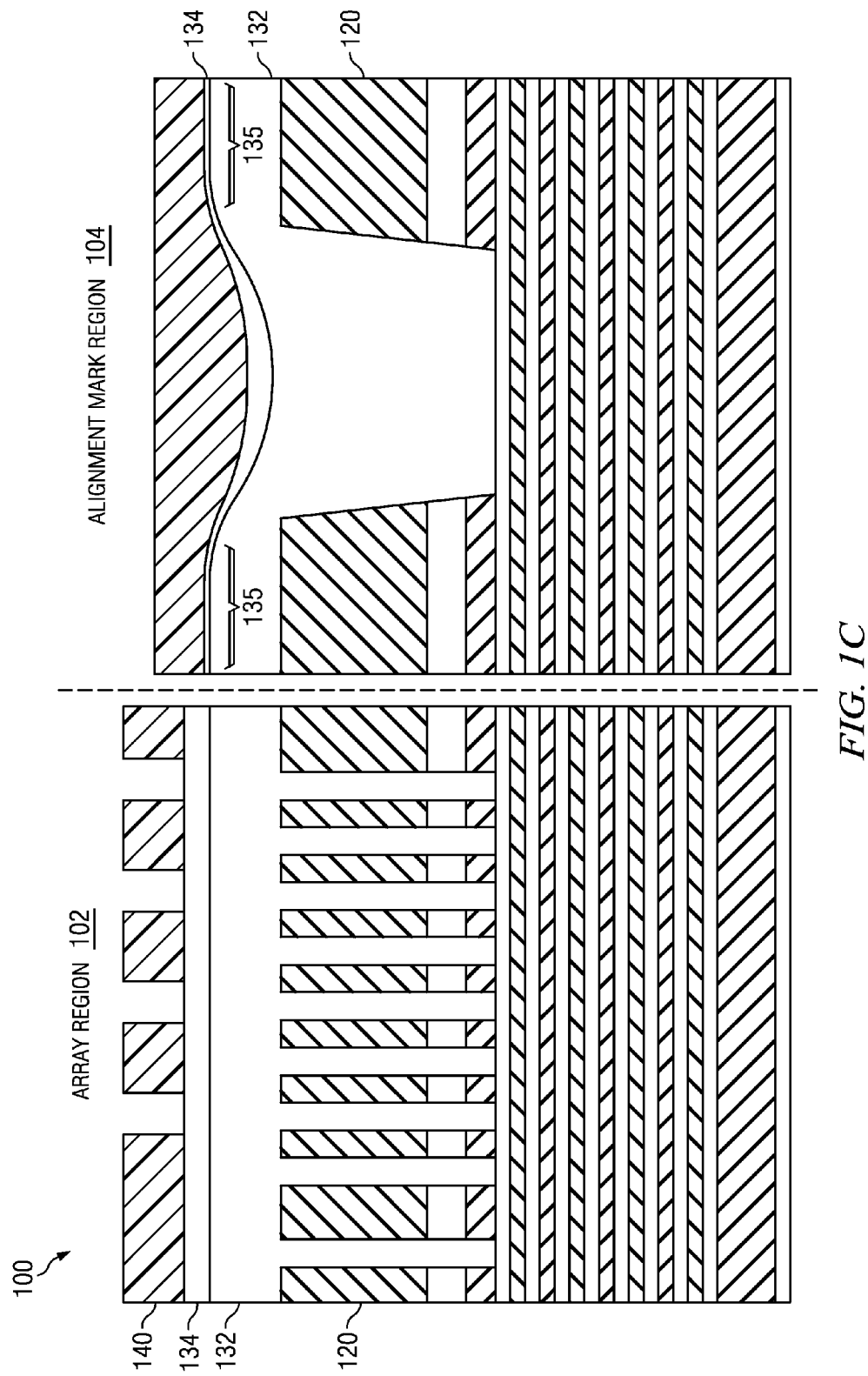
Figure 1D:
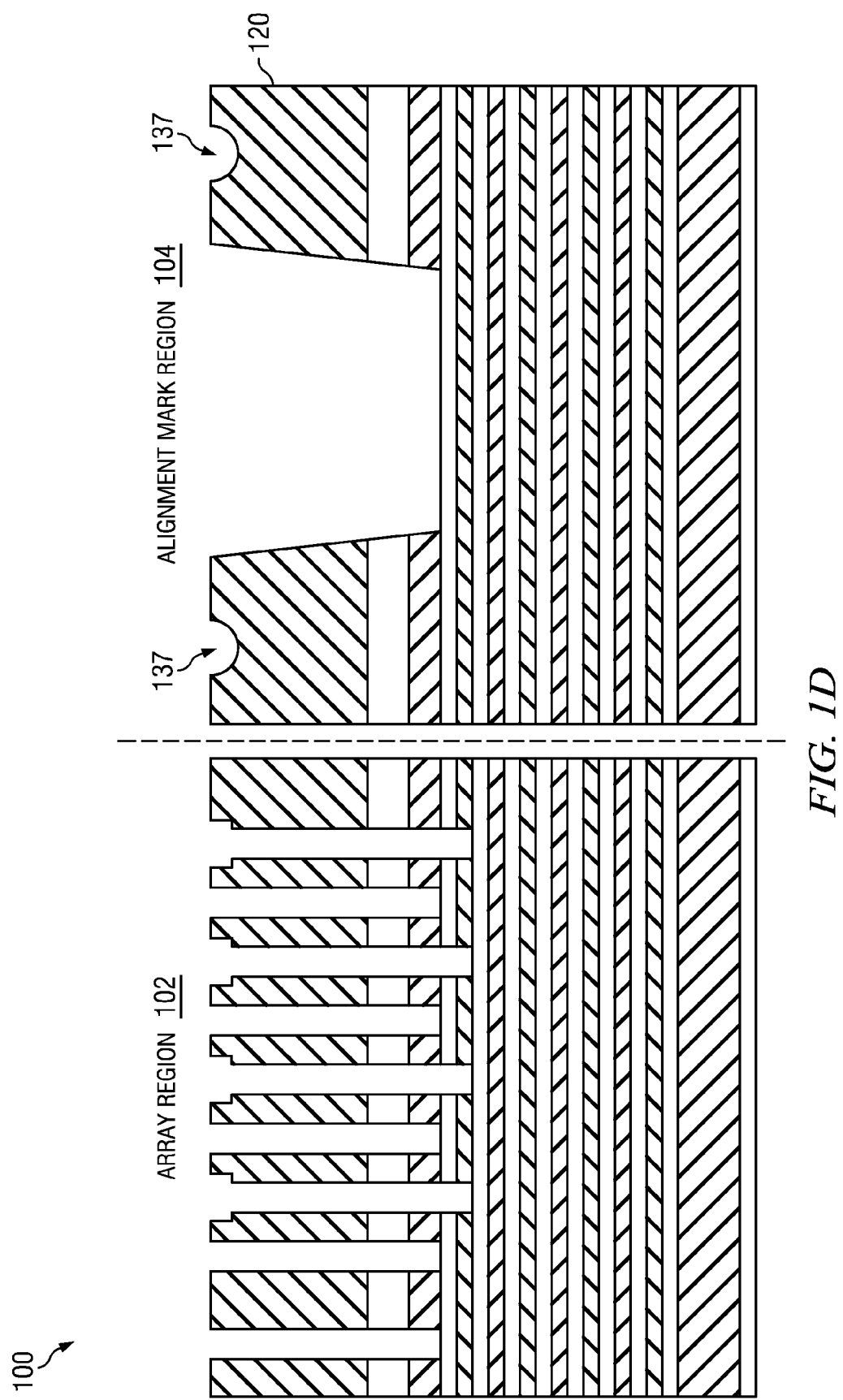
Figure 1E:
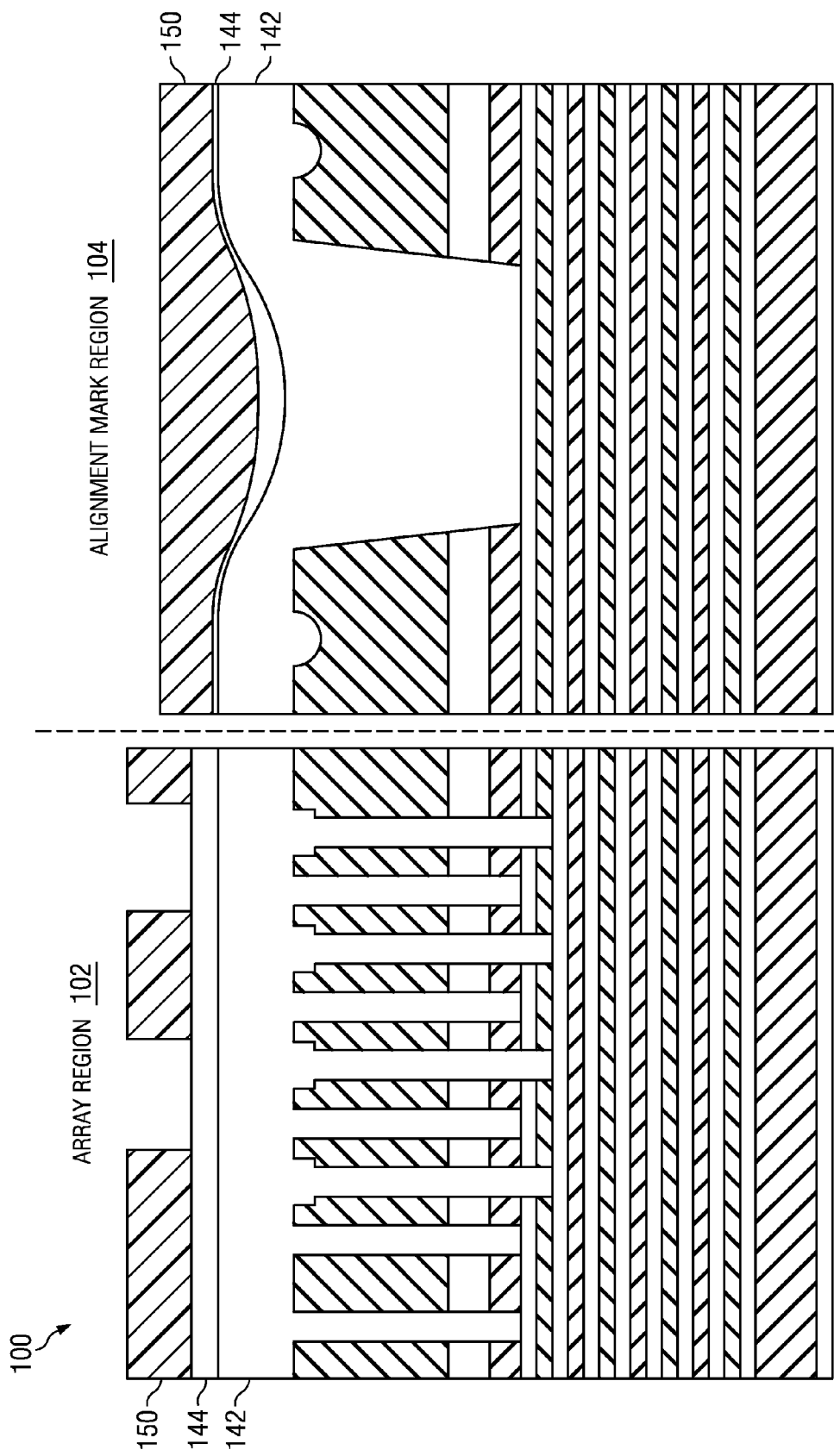
Figure 1F:
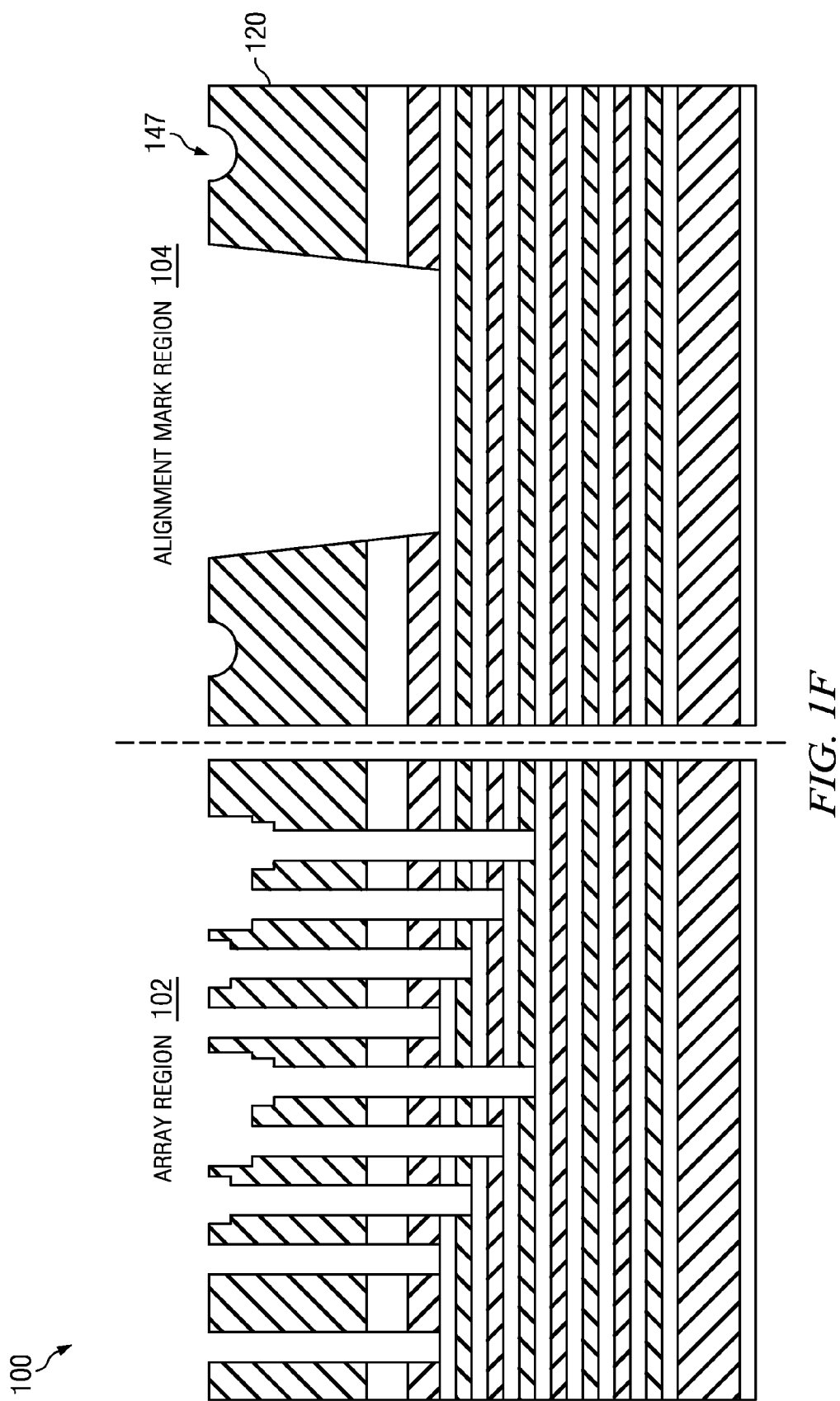
Figure 1G:
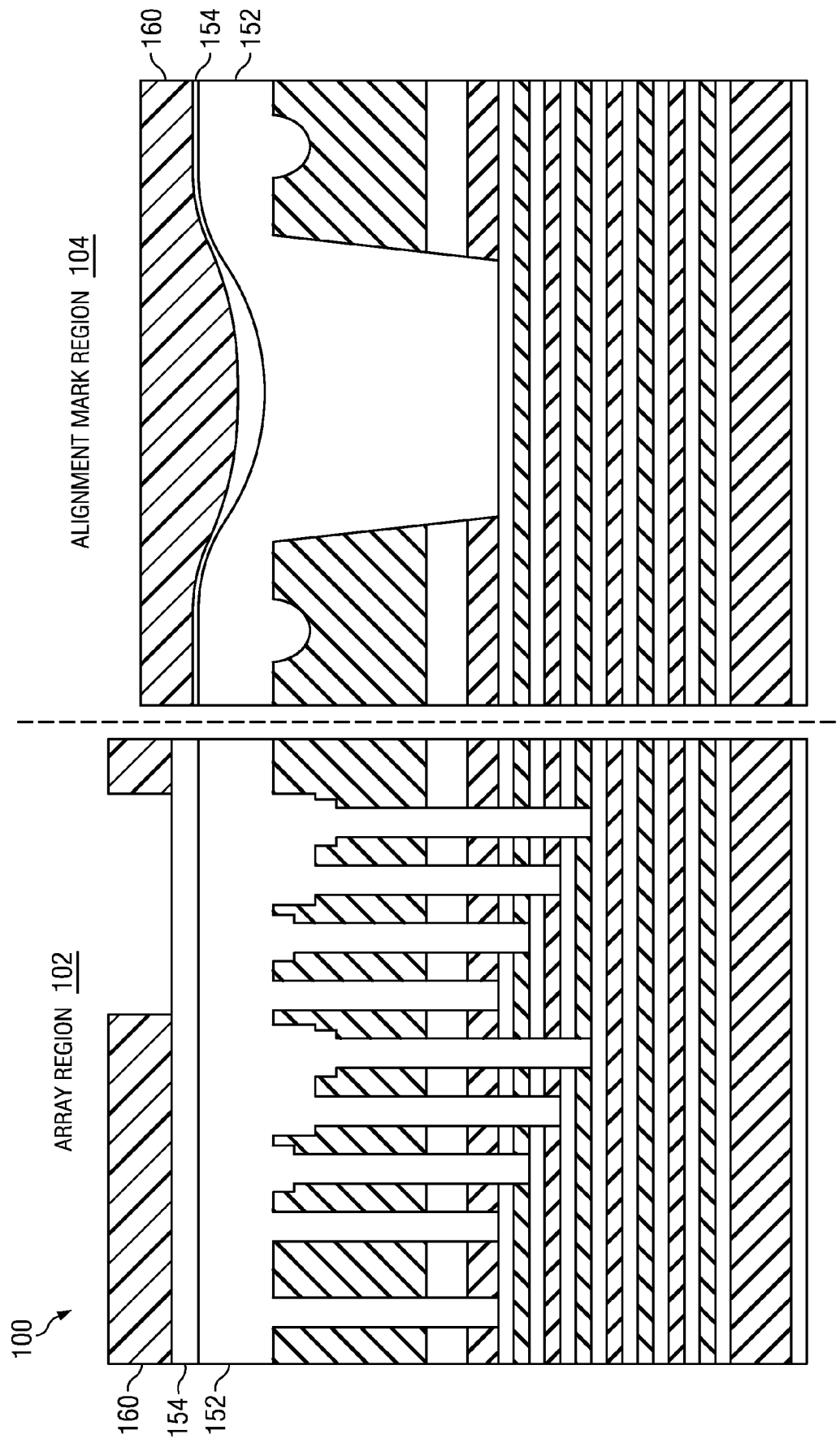
Figure 1I:
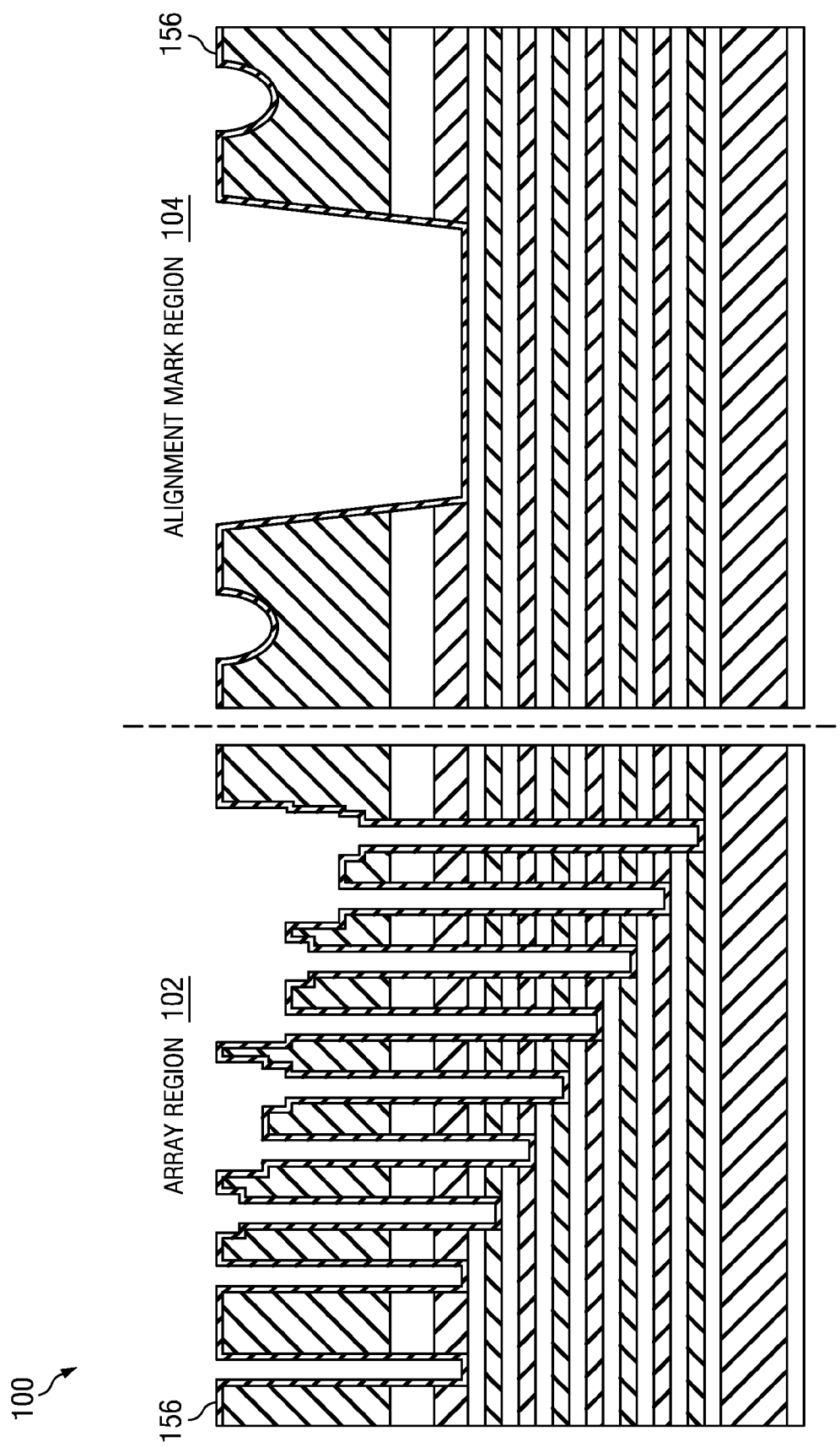
Figure 1J:
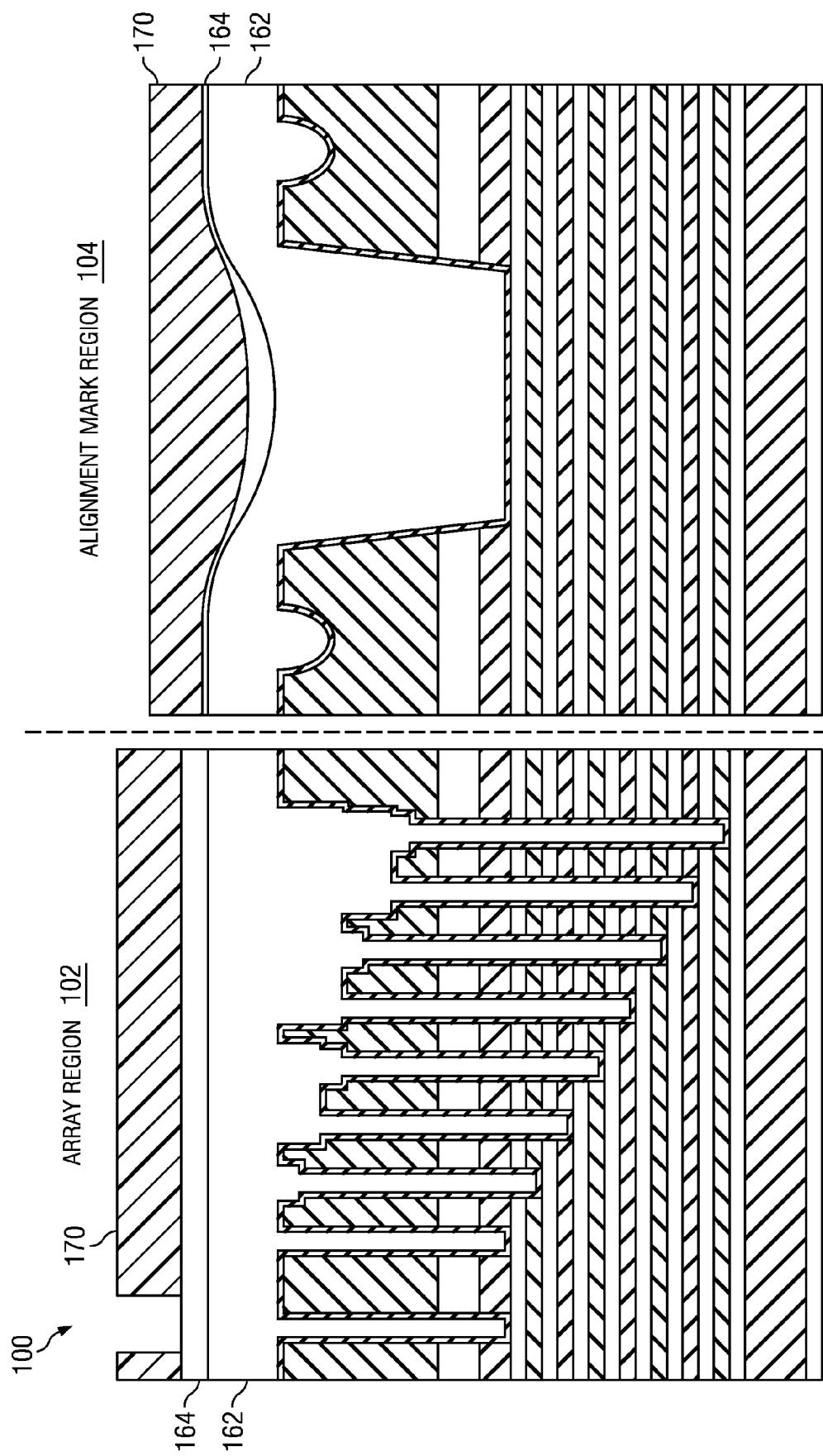
Figure 1K:
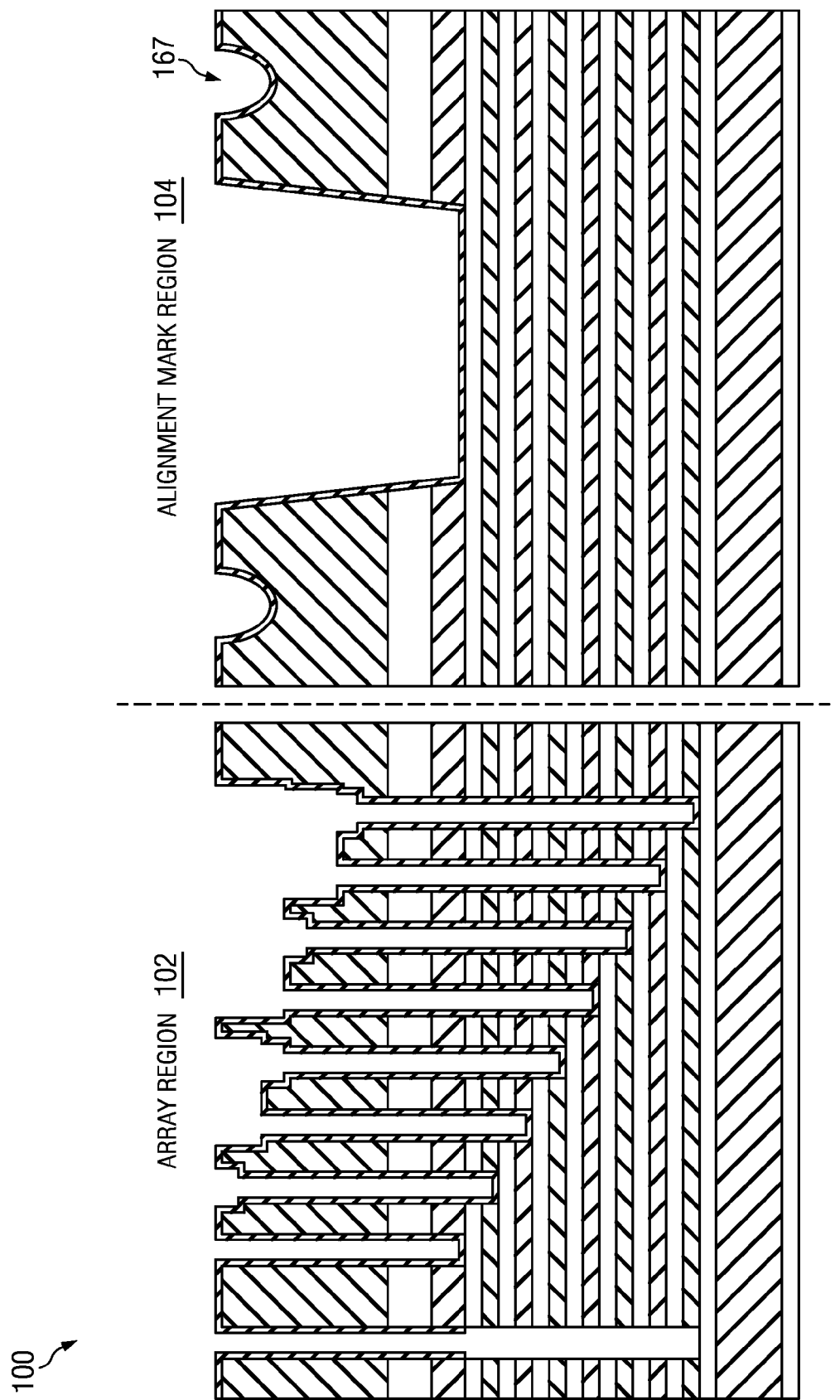
Figure 1L:
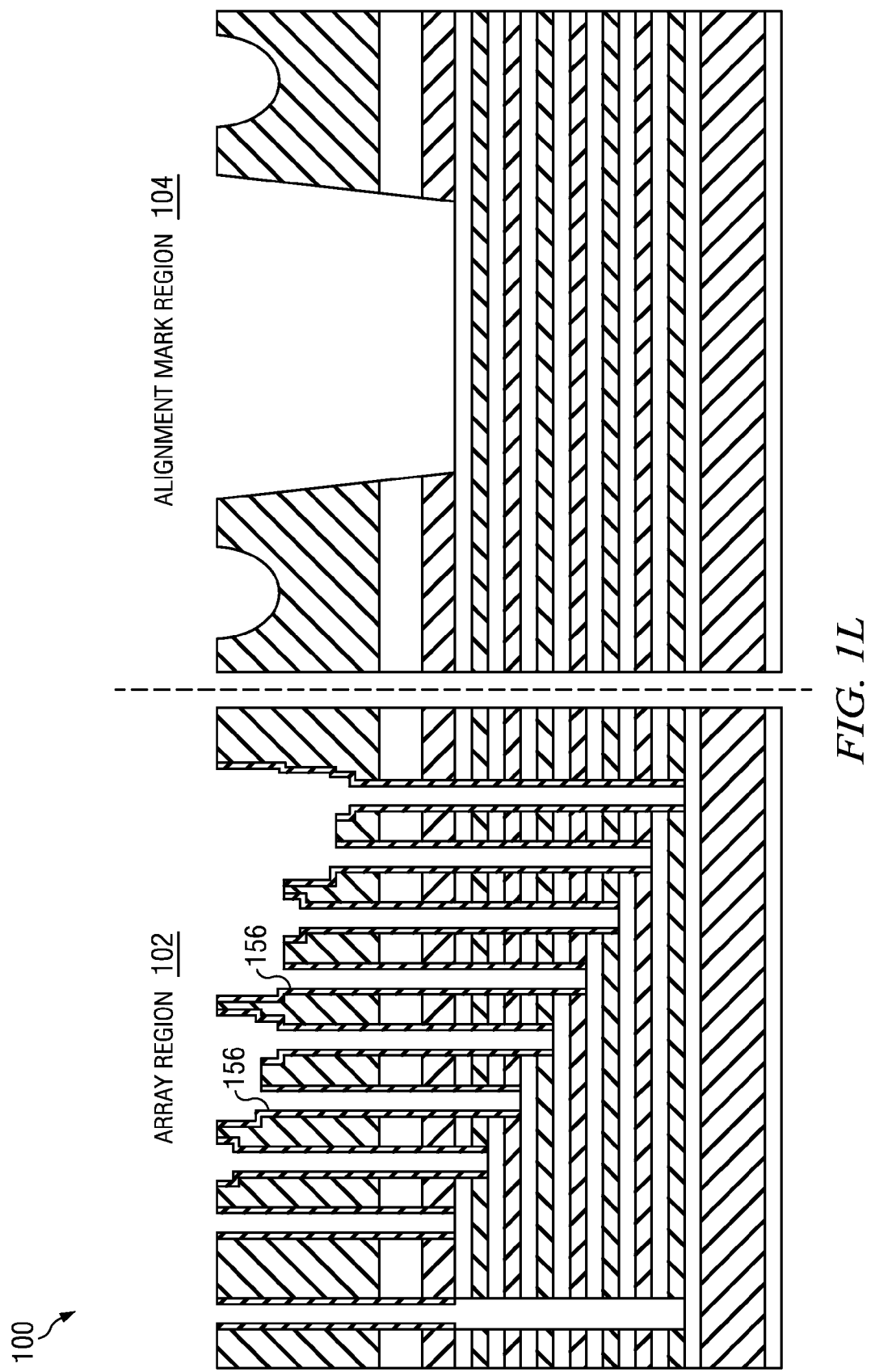
Figure 1M:
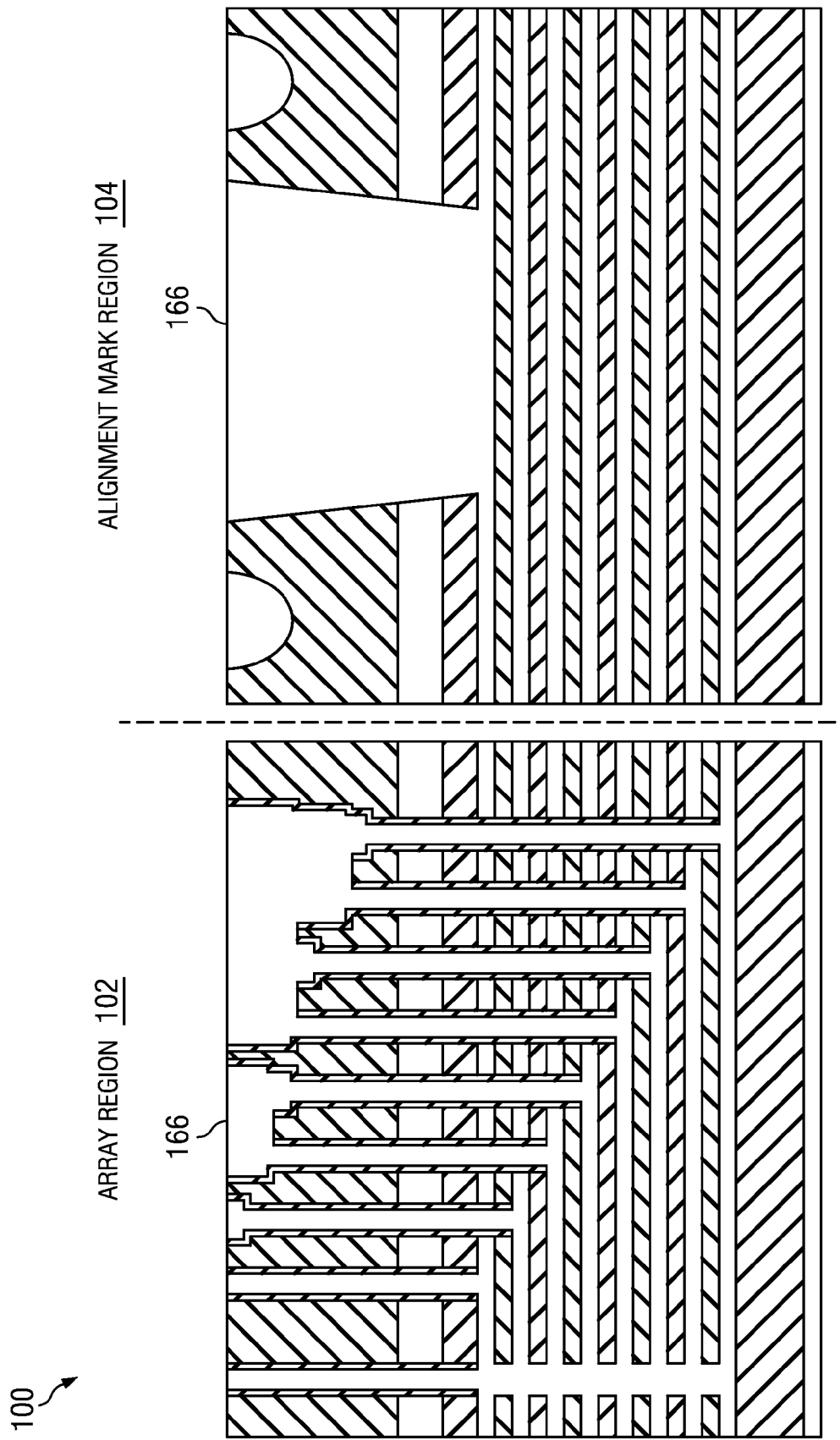
Figure 1N:
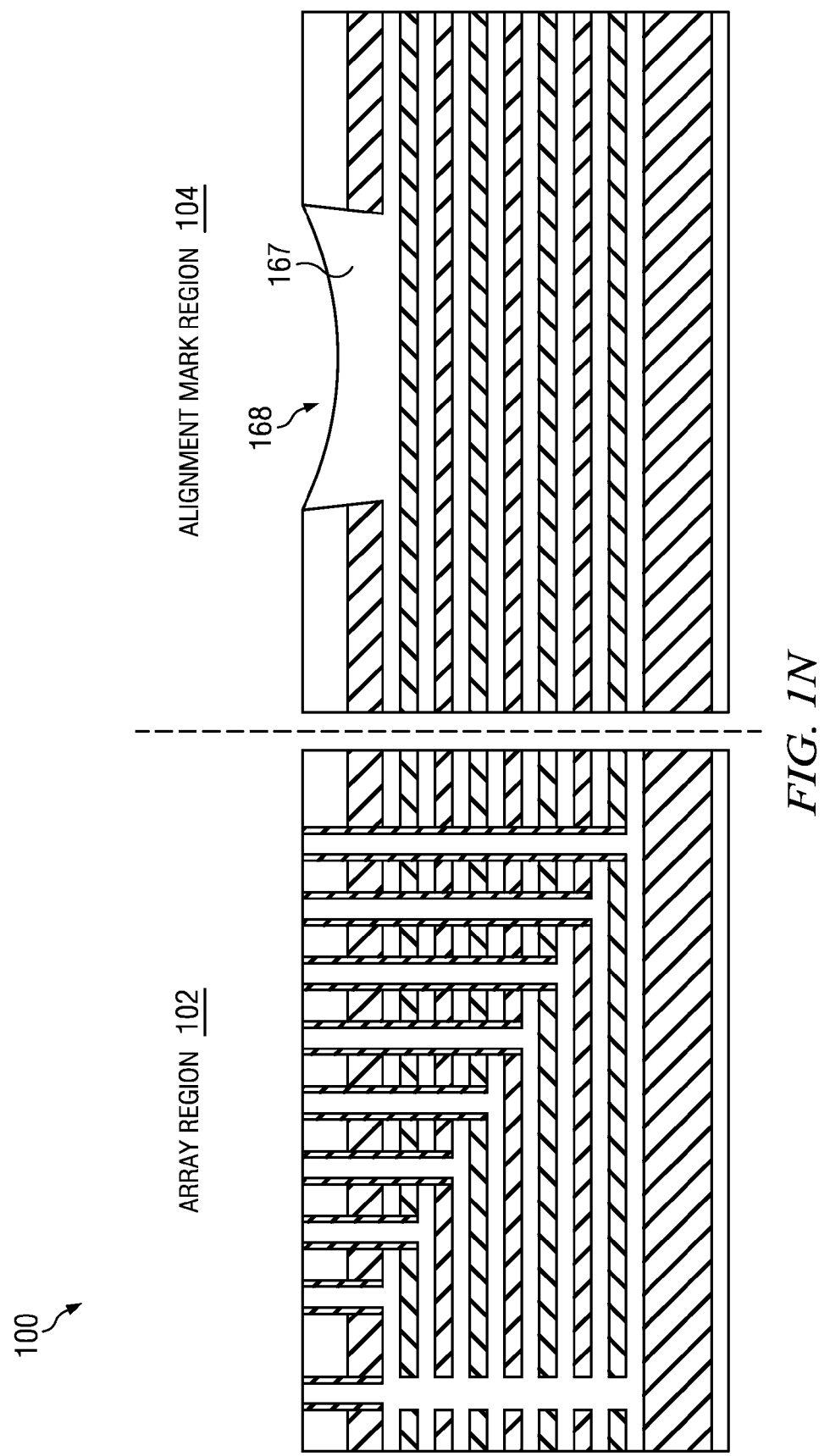
Figure 10:
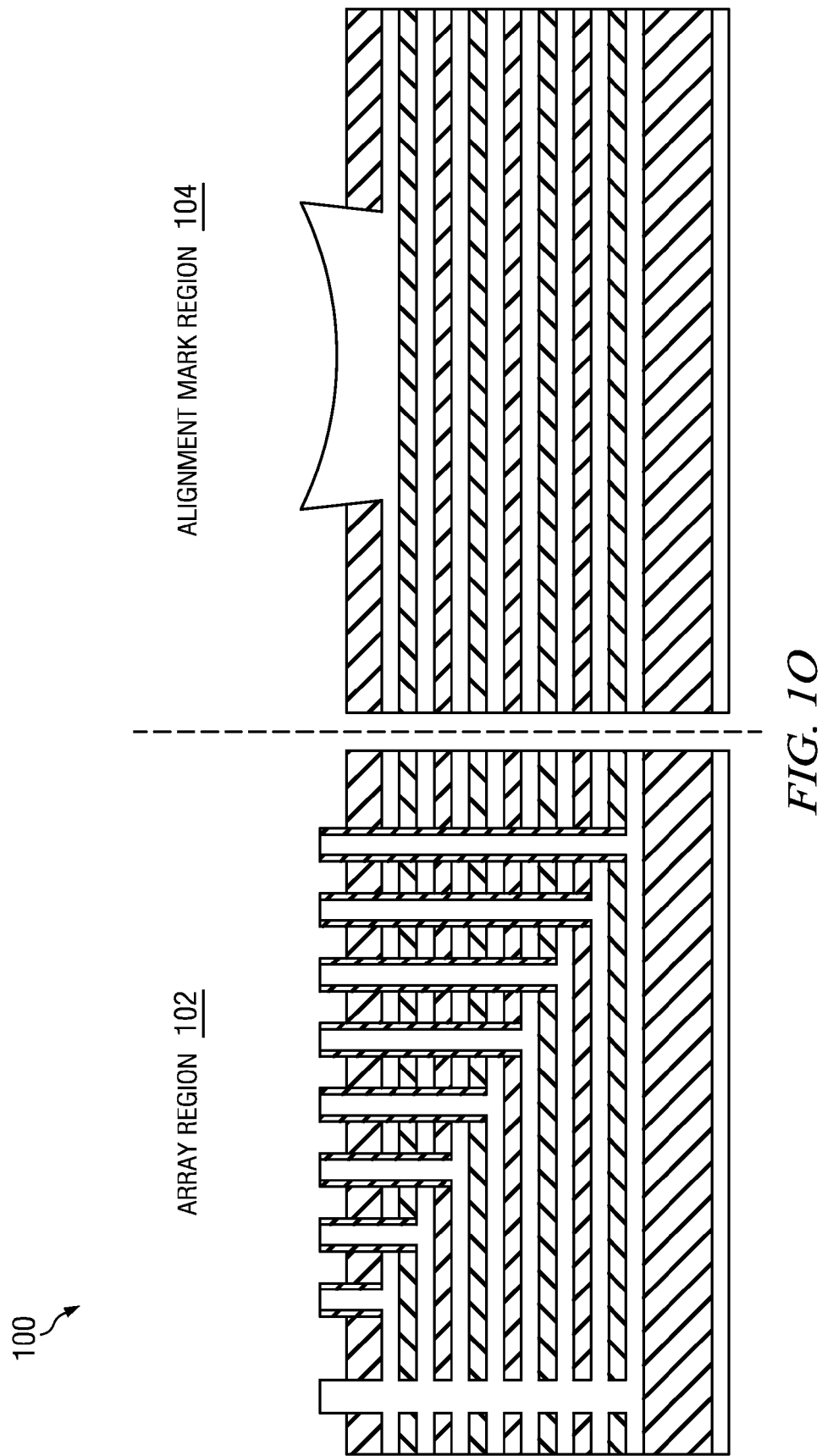
Figure 1P:
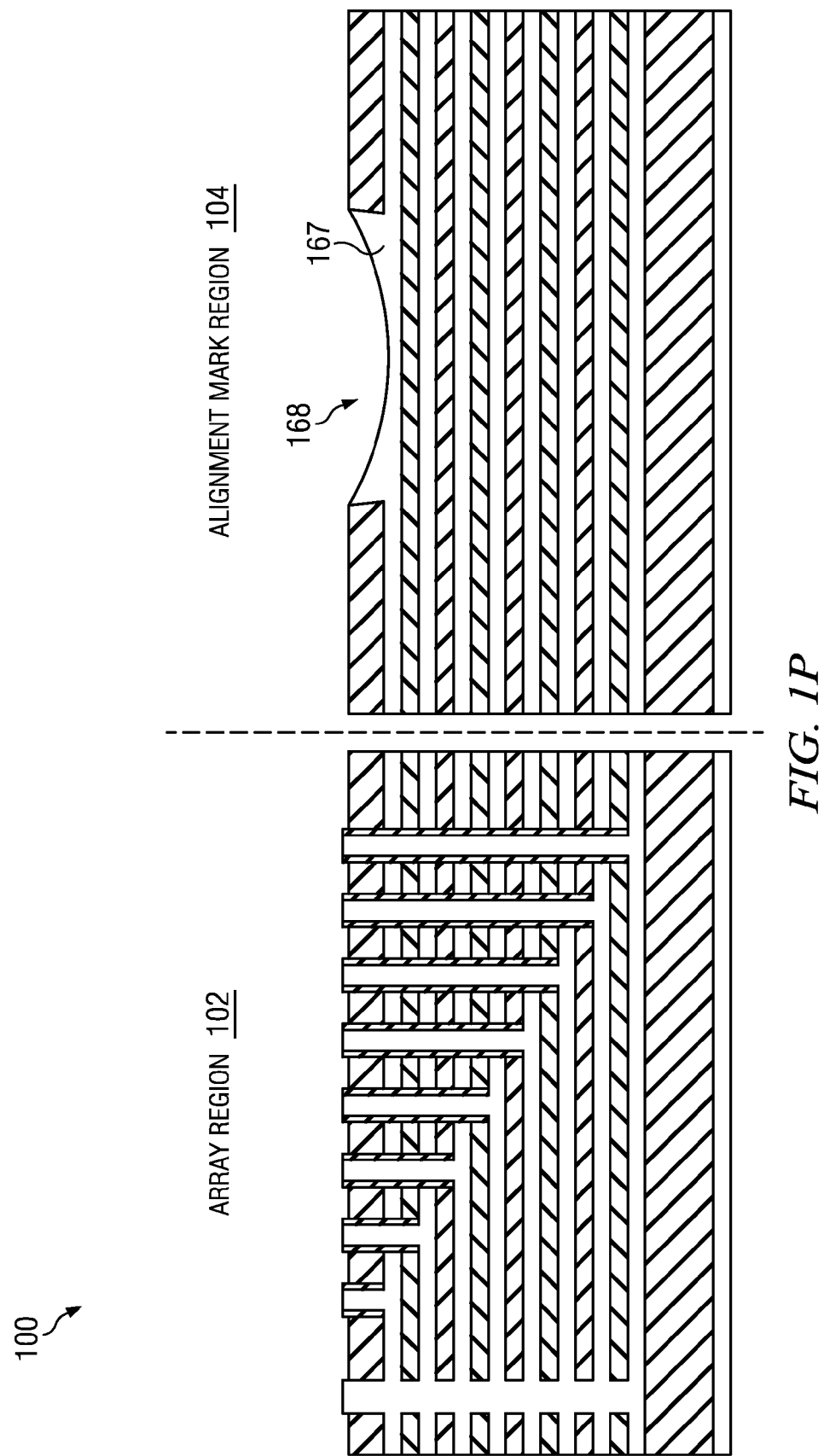
Figure 1Q:
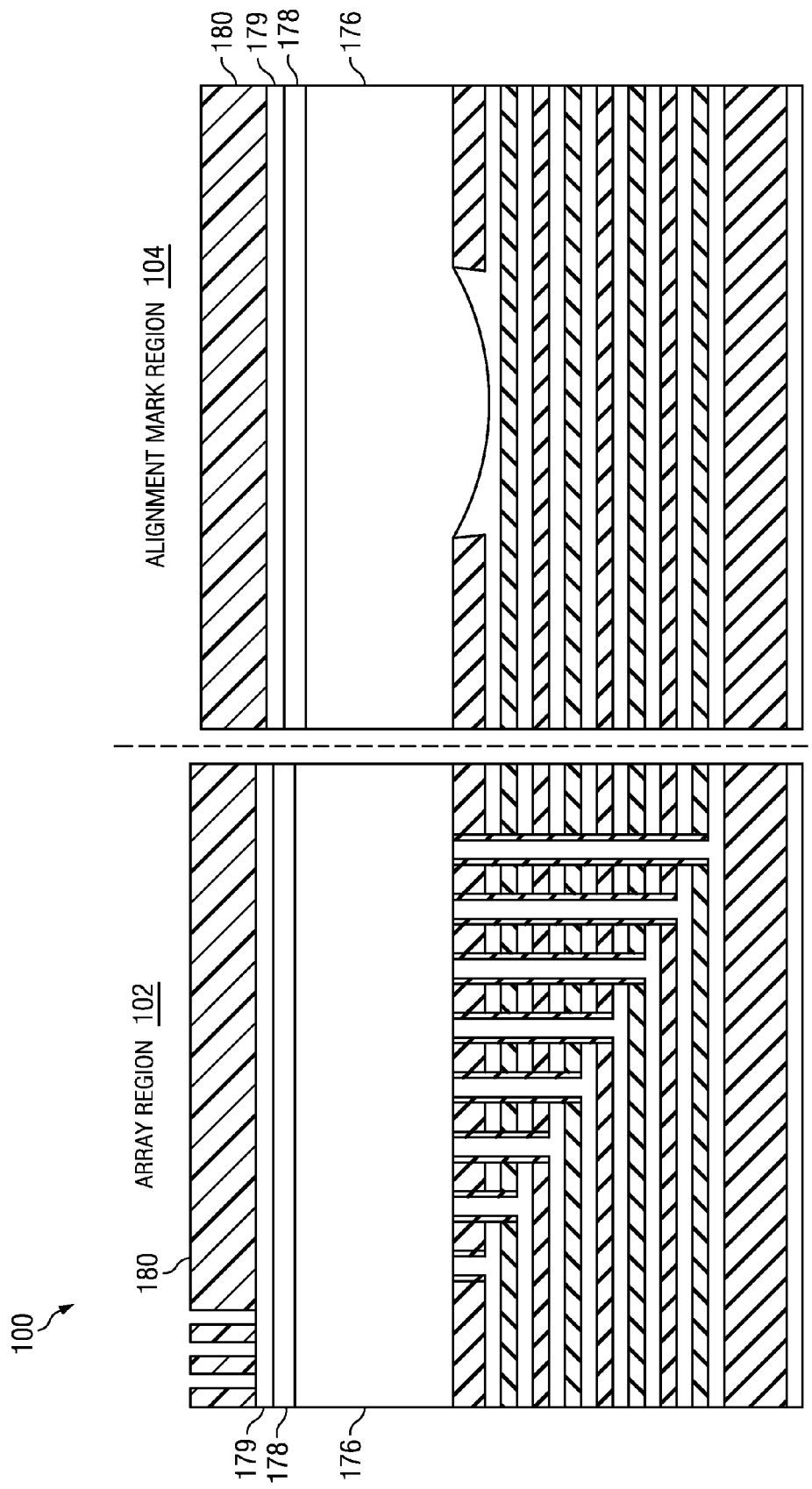

FIGS. 1A-1Q are schematic diagrams illustrating formation of semiconductor devices with alignment marks. Referring first to FIG. 1A, the semiconductor device 100 includes an array region 102 and an alignment mark region 104. The semiconductor device 100 includes a substrate 110, polysilicon layers 112, primary oxide layers 114, secondary oxide layer 116, silicon nitride (SiN) layer 118, tertiary oxide layer 120, advanced patterning film (APF) layer 122, and dielectric anti-reflective coating (DARC) layer 124, bottom anti-reflective coating (BARC) layer 125, and photo resist layer 126. The photo resist layer 126 is patterned for plug formation.

Referring now to FIG. 1B, the semiconductor device undergoes an etching process to form the plugs 130 in both the array region 102 and the alignment mark region 104. The plugs 130 extend down through the tertiary oxide layer 120, silicon nitride (SiN) layer 118, and secondary oxide layer 116.

Referring now to FIG. 1C, an optical dispersive layer (ODL) 132, a silicon-containing hard mask bottom anti-reflection coating (SHB) layer 134, and a photo resist layer 140 are formed over the tertiary oxide layer 120. At this stage, due to the dimensions of the plug formation in the alignment mark region 104, the SHB layer 134 in the alignment mark region 104 has thinned at the shoulder portions 135, and the layers formed over the alignment mark region are uneven.

Referring now to FIG. 1D, the semiconductor device undergoes an etching process. The optical dispersive layer (ODL), a silicon-containing hard mask bottom anti-reflection coating (SHB) layer, and a photo resist layer are removed during the etching process. Due to the uneven layers in the alignment mark region 104 (as seen in FIG. 1C), the tertiary oxide layer 120 has damaged portions 137 from the etching process.

Referring now to FIG. 1E, another optical dispersive layer (ODL) 142, another silicon-containing hard mask bottom anti-reflection coating (SHB) layer 144, and another photo resist layer 150 are formed over the tertiary oxide layer 120. At this stage, the alignment mark region 104, the SHB layer is again thinned at the shoulder portions, and the layers formed over the alignment mark region are again uneven.

Referring now to FIG. 1F, the semiconductor device undergoes an etching process. The optical dispersive layer (ODL), the silicon-containing hard mask bottom anti-reflection coating (SHB) layer, and the photo resist layer are again removed during the etching process. Due to the uneven layers in the alignment mark region 104 (as seen in FIG. 1E), the tertiary oxide layer 120 may again be damaged 147 during the etching process.

Referring now to FIG. 1G, another optical dispersive layer (ODL) 152, another silicon-containing hard mask bottom anti-reflection coating (SHB) layer 154, and another photo resist layer 160 are formed over the tertiary oxide layer 120. At this stage, the alignment mark region 104, the SHB layer is again thinned at the shoulder portions, and the layers formed over the alignment mark region are uneven.

Referring now to FIG. 1H, the semiconductor device undergoes an etching process. The optical dispersive layer (ODL), the silicon-containing hard mask bottom anti-reflection coating (SHB) layer, and the photo resist layer are again removed during the etching process. Due to the uneven layers in the alignment mark region 104 (as seen in FIG. 1E), the tertiary oxide layer 120 may again be damaged 157 during the etching process.

Referring now to FIG. 1I, a spacer layer 156 is deposited over the semiconductor device. Referring now to FIG. 1J, another optical dispersive layer (ODL) 162, another silicon-containing hard mask bottom anti-reflection coating (SHB) layer 164, and another photo resist layer 170 are formed over the tertiary oxide layer 120 and spacer layer 156. At this stage, the alignment mark region 104, the SHB layer is again thinned at the shoulder portions, and the layers formed over the alignment mark region are uneven.

Referring now to FIG. 1K, the semiconductor device undergoes another etching process. The optical dispersive layer (ODL), the silicon-containing hard mask bottom anti-reflection coating (SHB) layer, and the photo resist layer are again removed during the etching process. Due to the uneven layers in the alignment mark region 104 (as seen in FIG. 1J), the tertiary oxide layer 120 may again be damaged 167 during the etching process.

Referring now to FIG. 1L, the semiconductor device undergoes breakthrough etching. The resulting array region 102 includes the spacer layer 156 remaining on sidewalls of the plug formations, but the spacer layer has been substantially removed from the top and bottom regions of the plug formations. Further the spacer layer has been substantially removed from the alignment mark region 104.

Referring now to FIG. 1M, the semiconductor device undergoes a polymer layer 166 deposition followed by chemical mechanical polishing, resulting in the plug formations being substantially filled with the polymer layer 166.

Referring now to FIG. 1N, the semiconductor device undergoes a planar etching process followed by another chemical mechanical polishing process. The polymer layer 167 in the alignment mark region 104 is removed substantially unevenly, resulting in a bowed shape 168 to the alignment mark plug formation.

Referring now to FIG. 1O, the Silicon Nitride (SiN) layer is removed. Referring now to FIG. 1P, the semiconductor device undergoes polymer layer chemical mechanical polishing. Again the polymer layer 167 in the alignment mark region 104 is removed substantially unevenly—specifically, the polymer material in the center of the alignment mark is removed more than that at the peripheral region of the alignment mark—resulting in a bowed shape 168 to the alignment mark plug formation.

Referring now to FIG. 1Q, an advanced patterning film (APF) 176, a dielectric anti-reflective coating (DARC) layer 178, a bottom anti-reflective coating (BARC) layer 179, and another photo resist layer 180 are formed over the semiconductor device. At this stage, the alignment mark region 104, the advanced patterning film (APF) layer is thicker toward the center of the alignment mark than toward the periphery of the alignment mark, due to the bowed shape of the polymer layer (discussed above).

Figure 2:
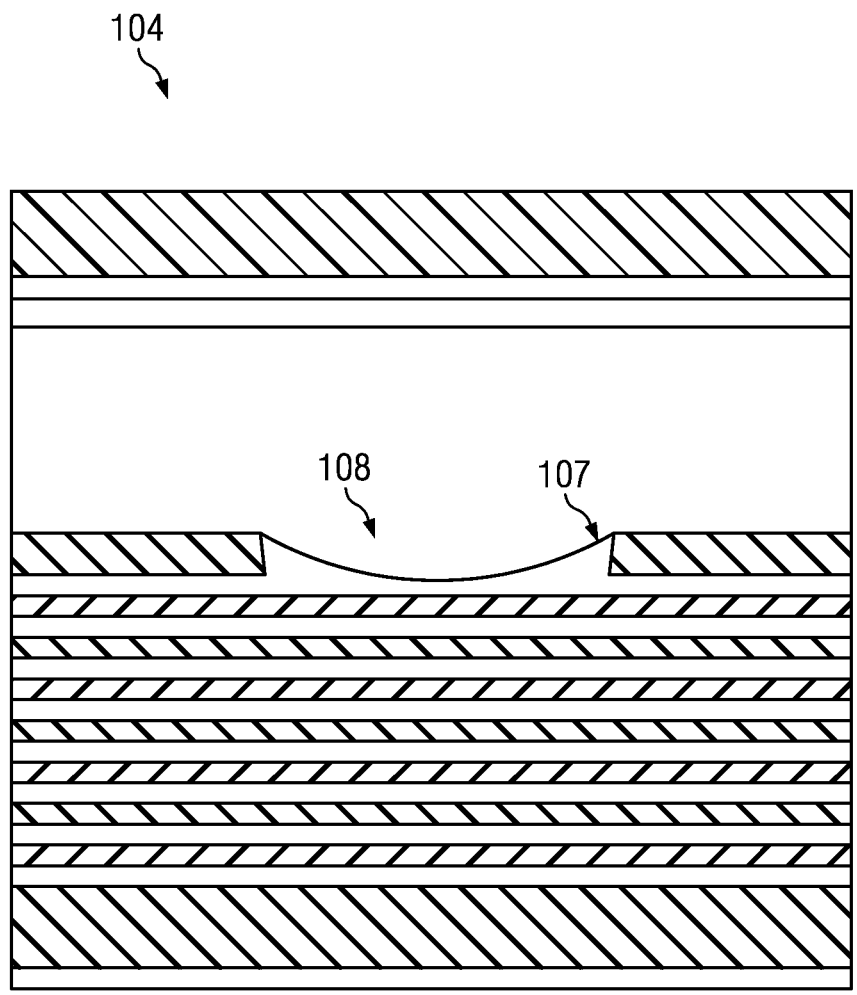
FIG. 2 is a schematic diagram illustrating an alignment mark region of a semiconductor device.

FIG. 2 is a schematic diagram illustrating an alignment mark region of a semiconductor device. The central portion 108 of the alignment mark is thinner than the periphery portion 107 of the alignment mark. This phenomenon lowers the contrast during detection of the alignment mark as well, which results in higher errors in aligning layers during semiconductor processing. At various stages in the semiconductor device formation discussed in FIGS. 1A-1Q, plug alignment will fail due to alignment mark damage after the various fill-in and etching and chemical mechanical processing processes.

Figure 3:
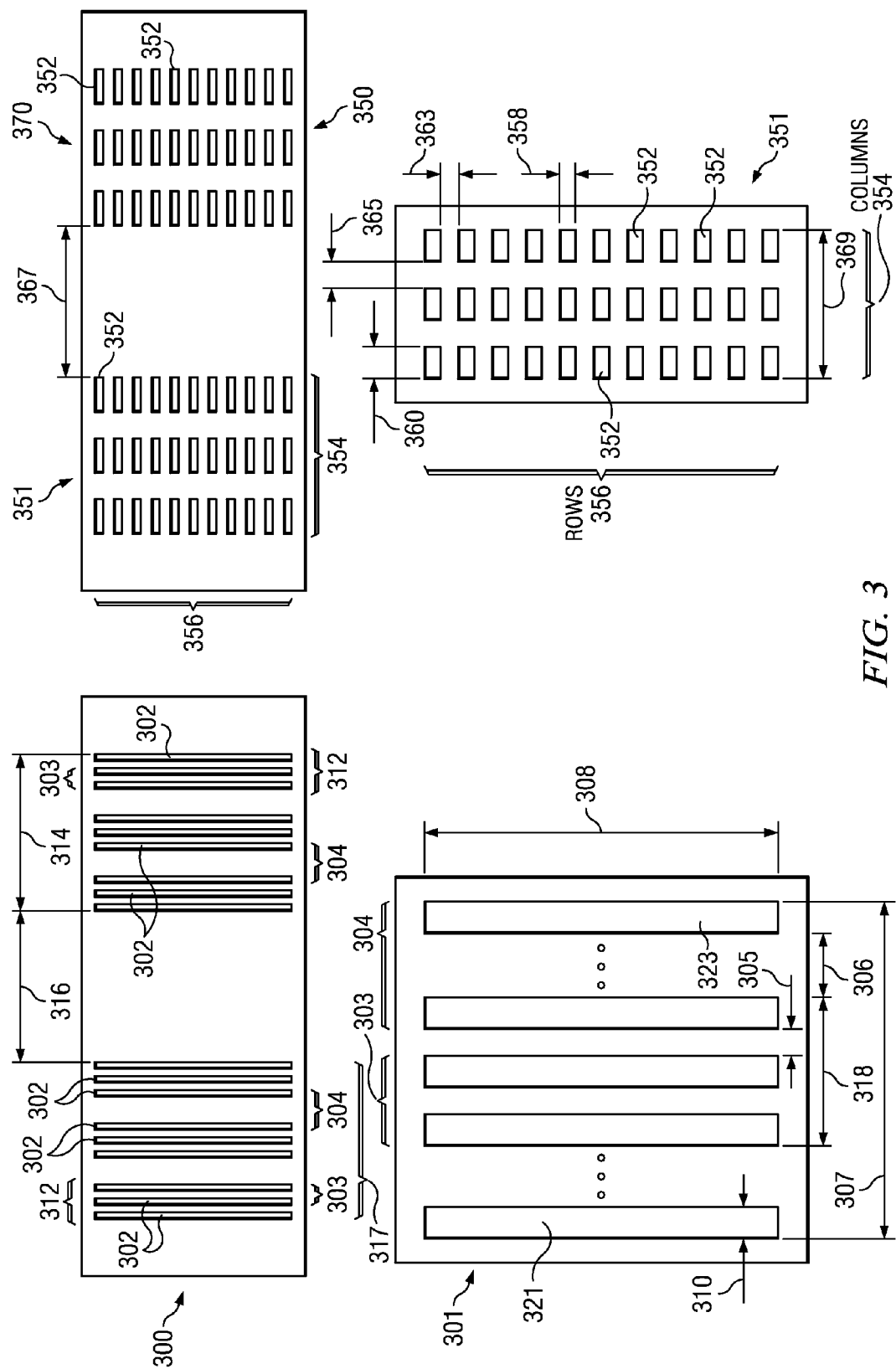
FIG. 3 is a schematic diagram illustrating alignment mark design, in accordance with the present disclosure.

FIG. 3 is a schematic diagram illustrating various exemplary alignment mark designs 300, 350 to substantially avoid the layer misalignment phenomenon and scanner alignment problems. The alignment mark designs substantially avoid or minimize damage during the fill-in and etching and chemical mechanical processing processes. Thus, additional processing steps to even out various layers or to address the misalignment problems may also be avoided.

A first alignment mark design 300 includes a plurality of columnar alignment marks 302. The first alignment mark design 300 is shown in further detail at 301. Two adjacent columnar alignment marks 303 are separated by a first distance 305 and two other adjacent columnar alignment marks 304 are separated by a second distance 306 greater than the first distance 305. Each of the columnar alignment marks has a columnar alignment mark width 310 and a columnar alignment mark height 308.

In some embodiments, the first distance 305 is in the range of 200 nm to 250 nm. The columnar alignment mark width 310 may be in the range of 150 nm to 200 nm. For example, in an embodiment, the first distance 305 is 230 nm and the columnar alignment mark width 310 is 170 nm.

The alignment mark designs 300 may include sets 312 of columnar alignment marks 302. The sets 312 each have two or more columnar alignment marks 302. In an embodiment, the alignment mark designs 300 include three sets 312 of columnar alignment marks 302, but other numbers of sets may be used. In some embodiments, the plurality of columnar alignment marks includes groupings 317 of two or more sets 312. Within each of the sets 312, the columnar alignment marks are separated by the first distance 305. The sets 312 are separated by the second distance 306.

In an embodiment, a grouping 317 may further define a grouping width 314 in the range of 7-9 µm, and each of the groupings 317 may be separated by a third distance 316 substantially equivalent to the grouping width 314. In some embodiments, a set 312 within a grouping 317 defines a set width 318 in the range of 1.4-1.8 µm, and the second distance 306 may be substantially equivalent to the set width 318.

An alignment mark design 300 may include one or more groupings 317 of columnar alignment mark sets 312. Further, a relationship defining various widths and distances based on a length L defined as a distance 307 between a first columnar alignment mark 321 and a last columnar alignment mark 323 of the one more groupings 317 can be shown as L=S·X+W· (X−1), where S is the width 310 of the columnar alignment marks 302, X is the number of columnar alignment marks 323 in the one or more groupings, and W is the first distance 305 between columnar alignment marks.

Another exemplary alignment mark design 350 for a semiconductor device having an array region and an alignment mark region includes an array 351 of alignment marks 352. The array 351 of alignment marks 352 includes a plurality of alignment columns 354 each having a plurality of alignment marks 352 defining rows 356 of the array 351. Each of the alignment marks 352 has an alignment mark width 360 and an alignment mark height 358. The alignment marks 352 in the plurality of alignment columns 354 are each separated by a first separation 363, and each of the plurality of alignment columns 354 are separated by a second separation 365. In an embodiment, the first separation 363 is shorter than the second separation 365. In an embodiment, the device of claim 1, the alignment mark height 358 is substantially equal to the first separation 363.

In some embodiments, the alignment mark height 358 may be in the range of 150 nm to 250 nm. The alignment mark width 360 may be in the range of 1500 nm to 1700 nm. The first separation 363 may be in the range of 150 nm to 250 nm, and the second separation is in the range of 1500 nm to 1700 nm. For example, in an embodiment, the alignment mark height 358 and the first separation 363 are approximately 200 nm, and the alignment mark width 360 and the second separation 365 are approximately 1600 nm.

Further, a relationship between the alignment mark height 358 and the first separation 363 is defined by: (H·Y)+D(Y−1)<72 µm, where H is the alignment mark height 358, Y is a number of the rows of the array, and D is the first separation 363.

An alignment mark design 350 may include one or more arrays of alignment marks. In an embodiment, a device may further include a second array 370 of alignment marks substantially similar to the array of alignment marks 351 and separated from the array of alignment marks 351 by a third separation 367. In an embodiment, the third separation 367 is substantially equal to a width 369 defined by the plurality of alignment mark columns 354.

Figure 4:
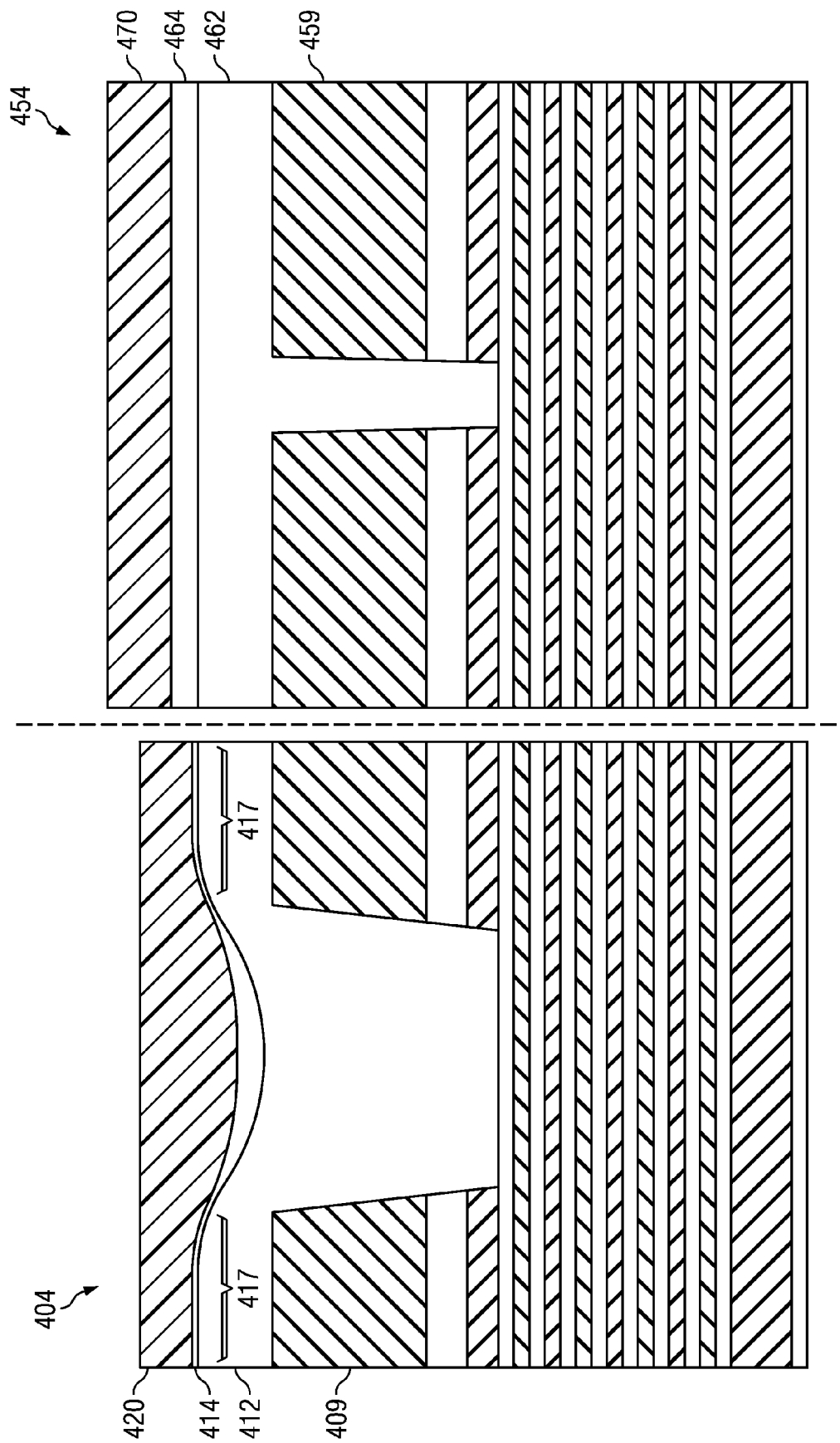
FIG. 4 is a schematic diagram illustrating alignment mark regions of semiconductor devices, in accordance with the present disclosure.

FIG. 4 is a schematic diagram illustrating a comparison between an alignment mark region 454 incorporating the first or second designs discussed above in relation to FIG. 3 and an alignment mark region 404 incorporating conventional alignment mark design/dimensions. With respect to the latter, after an optical dispersive layer (ODL) 412, silicon-containing hard mask bottom anti-reflection coating (SHB) layer 414, and photo resist layer 420 are formed over the tertiary oxide layer 409, the SHB layer 414 is thinned at the shoulder portions 417, and the layers formed over the alignment mark region 404 are uneven. With respect to the former, after an optical dispersive layer (ODL) 462, silicon-containing hard mask bottom anti-reflection coating (SHB) layer 464, and photo resist layer 470 are formed over the tertiary oxide layer 459, the SHB layer 464 is substantially even, and the layers formed over the alignment mark region 454 are also substantially even. Thus, the new designs disclosed herein substantially solve the shoulder thinning problem of conventional techniques.

FIG. 5 is another schematic diagram illustrating a comparison between alignment mark region 554 incorporating the first or second designs discussed above in relation to FIG. 3 and an alignment mark region 504 incorporating conventional alignment mark design/dimensions. With respect to the latter, the alignment mark region 508 polymer is a bowed shape—with the center being a much thinner layer of polymer than the periphery. As discussed above, it is more difficult to detect the alignment mark due to this bowing phenomenon.

With respect to the former, after an optical dispersive layer (ODL), silicon-containing hard mask bottom anti-reflection coating (SHB) layer, and photo resist layer are formed over the tertiary oxide layer, the alignment mark region 558 polymer is substantially even, and the layers formed over the alignment mark region 554 are also substantially even. Thus, the new designs disclosed herein substantially solve the shoulder thinning problem of conventional techniques. During inspection, the higher contrast alignment mark can be more easily observed using the new designs.

Figure 6:
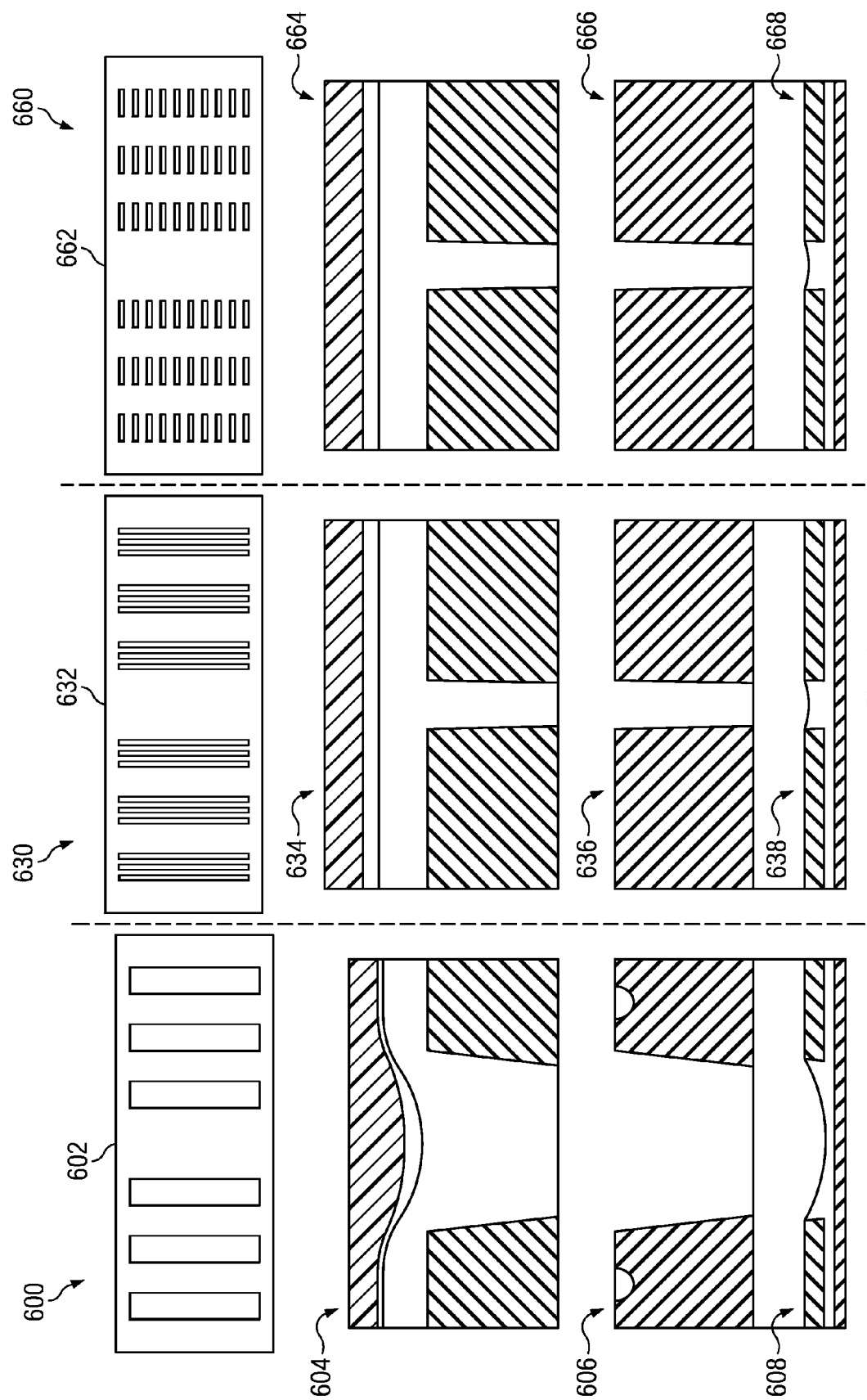
FIG. 6 is another schematic diagram illustrating alignment mark regions of semiconductor devices, in accordance with the present disclosure.

FIG. 6 is a schematic diagram illustrating a comparison between alignment mark region 600 incorporating conventional alignment mark designs 602, alignment mark region 630 incorporating first design alignment mark embodiments 632, and alignment mark region 660 incorporating second design alignment mark embodiments 662. The conventional alignment mark designs 602 result in uneven layers 604 in the alignment mark region after fill-in, damaged oxide layers 606 in the alignment mark region after etching, and a bowed-shaped alignment mark polymer 608 after chemical mechanical polishing. These items result in compromised alignment performance. For example, the damaged oxide layers 606 in the alignment mark region 600 results in lower contrast during detection of the alignment mark, which causes errors in aligning layers during semiconductor processing. The alignment mark designs discussed below may address this issue and substantially reduce such errors.

The first design alignment mark embodiments 632 result in substantially even layers 634 in the alignment mark region after fill-in, minimal or no damage to oxide layers 636 in the alignment mark region after etching, and a substantially even shape alignment mark polymer film 638 after chemical mechanical polishing. These items result in better alignment performance.

The second design alignment mark embodiments 662 result in substantially even layers 664 in the alignment mark region after fill-in, minimal or no damage to oxide layers 666 in the alignment mark region after etching, and a substantially even shape alignment mark polymer film 668 after chemical mechanical polishing. These items result in better alignment performance.

Figure 7:
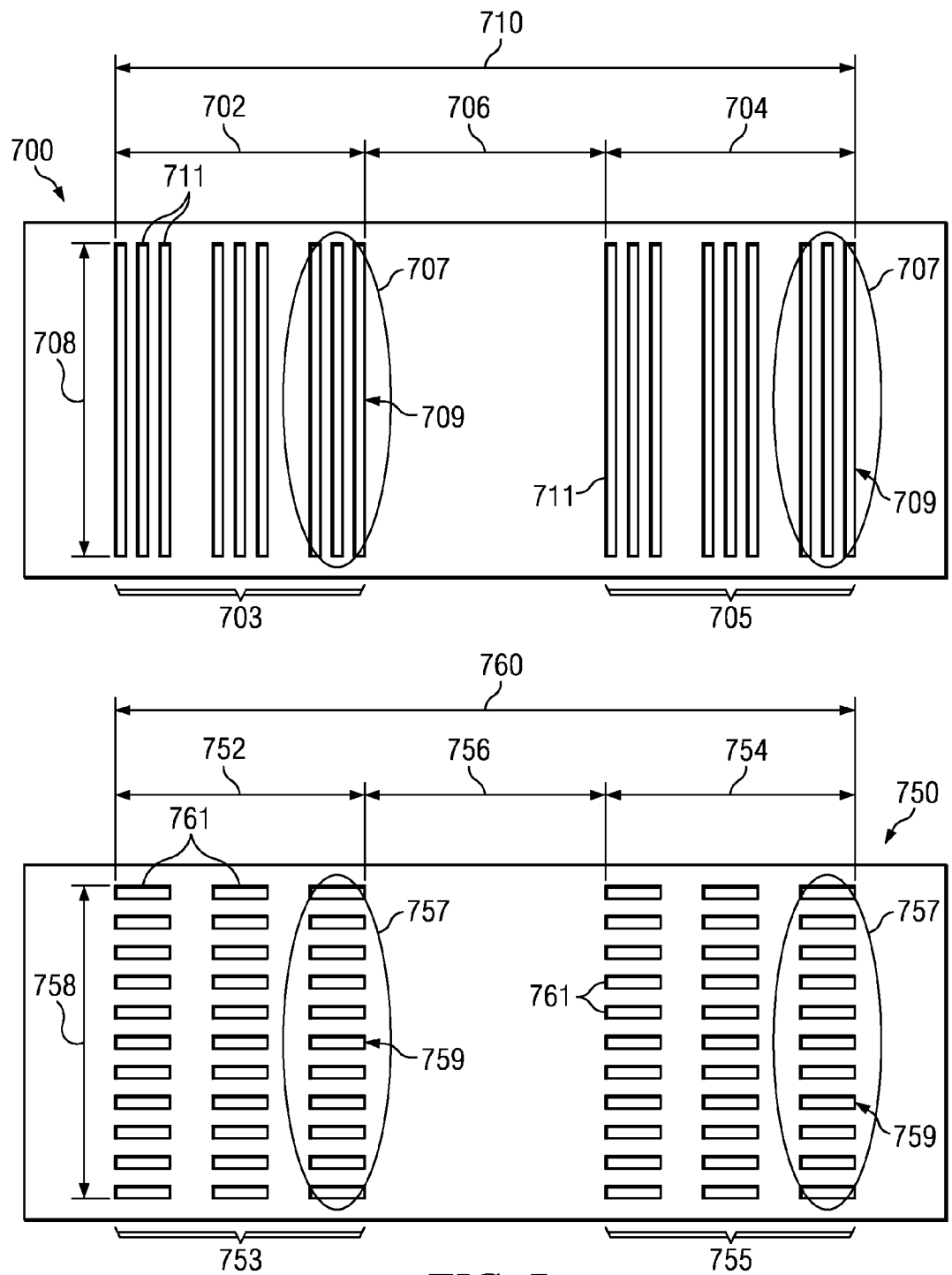
FIG. 7 is a schematic diagram illustrating alignment mark design, in accordance with the present disclosure.

FIG. 7 is a schematic diagram illustrating exemplary alignment mark designs 700, 750 and their respective dimensions. A semiconductor device may include an alignment mark region with exemplary mark designs 700, 750. The alignment mark designs may include first alignment mark groups 703, 753 having a plurality of alignment mark column sets 707, 757 and second alignment mark groups 705, 755 having a plurality of alignment mark column sets 707, 757. The alignment mark column sets 707, 757 each have a plurality of alignment mark elements 709, 759. The total width of the first and second alignment mark groups 703, 753 and 705, 755 is a mark design width 710 in the range of 40-820 μm.

In some embodiments of the exemplary alignment mark designs, the first alignment mark groups 703, 753 have a first group width 702, 752 in the range of 7-9 μm, wherein the second alignment mark groups 705, 755 have a second group width 704, 754 in the range of 7-9 μm, the first and second alignment mark groups (703, 753 and 705, 755) are separated by a group separation distance 706, 756 in the range of 6-10 μm. In an embodiment, the exemplary alignment mark designs have a height 708, 758 in the range of 20-74 μm.

In an embodiment, an exemplary alignment mark design 700 is further defined by the features discussed above in relation to FIG. 3, alignment mark design 300. For example, the plurality of alignment mark elements 709 may be a plurality of columnar alignment marks 711. The first and second group widths 702, 704 may be approximately 8 μm and the group separation distance 706 may be approximately 8.8 μm.

In another embodiment, an exemplary alignment mark design 750 is further defined by the features discussed above in relation to FIG. 3, alignment mark design 350. For example, the plurality of alignment mark elements 759 may be a plurality of alignment mark row elements 761. The first and second group widths 752, 754 may be approximately 8 μm and the group separation distance 756 may be approximately 8.8 μm.

FIG. 8 is a schematic diagram illustrating alignment mark design illustrating a comparison between alignment mark region 800 incorporating conventional alignment mark designs 802, alignment mark region 830 incorporating exemplary dimensions for first design alignment mark embodiments 832, and alignment mark region 860 incorporating exemplary dimensions for second design alignment mark embodiments 862. As shown in FIG. 8, the conventional design of alignment marks are substantially larger dimension than the alignment mark design of the present disclosure.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An alignment mark region of a semiconductor device, the alignment mark region comprising:
    an array of alignment marks comprising a plurality of alignment columns, the alignment columns each having a plurality of alignment marks defining rows of the array, wherein adjacent alignment marks in the plurality of alignment columns are separated by a first separation, and wherein adjacent alignment columns are separated by a second separation; and
    a second array of alignment marks substantially similar to the array of alignment marks and separated from the array of alignment marks by a third separation,
    wherein the third separation is substantially equal to a width defined by the plurality of alignment mark columns.

2. The device of claim 1, wherein the first separation is shorter than the second separation.

3. The alignment mark region of claim 1, wherein the alignment marks have an alignment mark width and an alignment mark height, and wherein the alignment mark height is substantially equal to the first separation.

4. The alignment mark region of claim 1, wherein the alignment marks have an alignment mark width and an alignment mark height, and wherein the alignment mark height is in the range of 150 nm to 250 nm.

5. The alignment mark region of claim 1, wherein the alignment marks have an alignment mark width and an alignment mark height, and wherein the alignment mark width is in the range of 1500 nm to 1700 nm.

6. The alignment mark region of claim 1, wherein the first separation is in the range of 150 nm to 250 nm.

7. The alignment mark region of claim 1, wherein the second separation is in the range of 1500 nm to 1700 nm.

8. The alignment mark region of claim 1, wherein the alignment marks have an alignment mark width and an alignment mark height, and wherein the alignment mark height and the first separation are approximately 200 nm, and wherein the alignment mark width and the second separation are approximately 1600 nm.

9. The alignment mark region of claim 1, wherein the alignment marks have an alignment mark width and an alignment mark height, and wherein a relationship between the alignment mark height and the first separation is defined by: $(H \cdot Y)+D(Y-1)<72$ μm, wherein H is the alignment mark height, Y is the number of the rows of the array, wherein D is the first separation.

10. An alignment mark region of a semiconductor device, the alignment mark region comprising:

a first alignment mark group having a plurality of alignment mark column sets; and a second alignment mark group having a plurality of alignment mark column sets, wherein the alignment mark column sets each have a plurality of alignment mark elements, and wherein a total width of the first and second alignment mark groups define a mark design width in the range of 40-820 μm, and wherein the plurality of alignment mark elements comprises a plurality of alignment mark row elements, and wherein the first alignment mark group has a first group width in the range of 7-9 μm, and wherein the second alignment mark group has a second group width in the range of 7-9 μm, and wherein the first and second alignment mark groups are separated by a group separation distance in the range of 6-10 μm.

11. The alignment mark region of claim 10, wherein a height of the first and second alignment mark groups is in the range of 20-74 μm.

* * * * *